(12) United States Patent
Kim et al.

(10) Patent No.: US 10,262,935 B2
(45) Date of Patent: Apr. 16, 2019

(54) MEMORY DEVICE AND METHOD OF DISPOSING CONDUCTION LINES OF THE SAME

(71) Applicant: Samsung Electronics Co., Ltd., Suwon-si (KR)

(72) Inventors: Young-Ju Kim, Hwaseong-si (KR); Su-A Kim, Seongnam-si (KR); Soo-Young Kim, Seoul (KR); Min-Woo Won, Suwon-si (KR); Bok-Yeon Won, Namyangju-si (KR); Ji-Suk Kwon, Seoul (KR); Young-Ho Kim, Hwaseong-si (KR); Ji-Hak Yu, Yongin-si (KR); Hyun-Chul Yoon, Yongin-si (KR); Seok-Jae Lee, Yongin-si (KR); Sang-Keun Han, Seongnam-si (KR); Woong-Dai Kang, Seongnam-si (KR); Hyuk-Joon Kwon, Yongin-si (KR); Bum-Jae Lee, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/677,054

(22) Filed: Aug. 15, 2017

(65) Prior Publication Data

US 2018/0174959 A1 Jun. 21, 2018

(30) Foreign Application Priority Data

Dec. 16, 2016 (KR) .......................... 10-2016-0172242

(51) Int. Cl.
*H01L 23/522* (2006.01)
*G11C 11/408* (2006.01)
(Continued)

(52) U.S. Cl.
CPC ...... *H01L 23/5225* (2013.01); *G11C 11/4087* (2013.01); *G11C 11/4091* (2013.01);
(Continued)

(58) Field of Classification Search
CPC . H01L 23/5225; H01L 23/50; H01L 23/5226; H01L 23/5286; H01L 23/522;
(Continued)

(56) References Cited

U.S. PATENT DOCUMENTS 5,563,820 A * 10/1996 Wada ..................... G11C 7/18
257/E27.098
6,345,010 B1 * 2/2002 Shimazaki ............... G11C 7/18
365/207

(Continued)

*Primary Examiner* — Ali Naraghi
*Assistant Examiner* — Stephen C Smith
(74) *Attorney, Agent, or Firm* — Muir Patent Law, PLLC

(57) ABSTRACT

A memory device including a memory cell array region, includes, column selection signal lines formed in a first column conduction layer of the memory cell array region and extending in a column direction, global input-output data lines formed in a second column conduction layer of the memory cell array region different from the first column conduction layer and extending in the column direction and power lines formed in a shield conduction layer of the memory cell array region between the first column conduction layer and the second column conduction layer. The noises in the signal lines and the power lines may be reduced and performance of the memory device may be enhanced by forming the column selection signal lines and the global input-output data lines in different column conduction layers and forming the power lines in the shield conduction layer between the column conduction layers.

20 Claims, 33 Drawing Sheets

(51) Int. Cl.
*G11C 11/4091* (2006.01)
*G11C 11/4097* (2006.01)
*H01L 23/528* (2006.01)
*H01L 23/00* (2006.01)
*H01L 23/50* (2006.01)
*H01L 23/552* (2006.01)
*G11C 7/10* (2006.01)
*G11C 7/06* (2006.01)

(52) U.S. Cl.
CPC .......... *G11C 11/4097* (2013.01); *H01L 23/50* (2013.01); *H01L 23/5226* (2013.01); *H01L 23/5286* (2013.01); *H01L 23/552* (2013.01); *H01L 24/06* (2013.01); *G11C 7/06* (2013.01); *G11C 7/1057* (2013.01); *H01L 24/20* (2013.01); *H01L 2224/02331* (2013.01); *H01L 2224/02373* (2013.01); *H01L 2224/02375* (2013.01); *H01L 2224/02379* (2013.01); *H01L 2224/02381* (2013.01); *H01L 2224/04105* (2013.01); *H01L 2224/06155* (2013.01); *H01L 2224/06159* (2013.01); *H01L 2224/12105* (2013.01); *H01L 2924/18162* (2013.01); *H01L 2924/3025* (2013.01)

(58) Field of Classification Search
CPC ........... H01L 24/06; H01L 2224/02331; H01L 2224/02373; H01L 2224/02375; H01L 2224/02379; H01L 2224/02381; H01L 2224/06144; H01L 2224/06159; G11C 7/06; G11C 7/1057; G11C 11/4087; G11C 11/4091; G11C 11/4097
See application file for complete search history.

(56) References Cited

U.S. PATENT DOCUMENTS

| | | |
|---|---|---|
| 6,617,621 B1 | 9/2003 | Gheewala et al. |
| 6,710,425 B2 | 3/2004 | Bothra |
| 6,980,462 B1 | 12/2005 | Ramesh et al. |
| 7,161,823 B2 | 1/2007 | Lee et al. |
| 7,259,978 B2 | 8/2007 | Park et al. |
| 8,006,218 B2 | 8/2011 | Chuang |
| 9,281,311 B2 | 3/2016 | Wu et al. |
| 9,286,998 B1 | 3/2016 | Singh et al. |
| 9,455,026 B2 | 9/2016 | Mojumder et al. |
| 2015/0325587 A1* | 11/2015 | Chen ................ H01L 27/11582 257/314 |

* cited by examiner

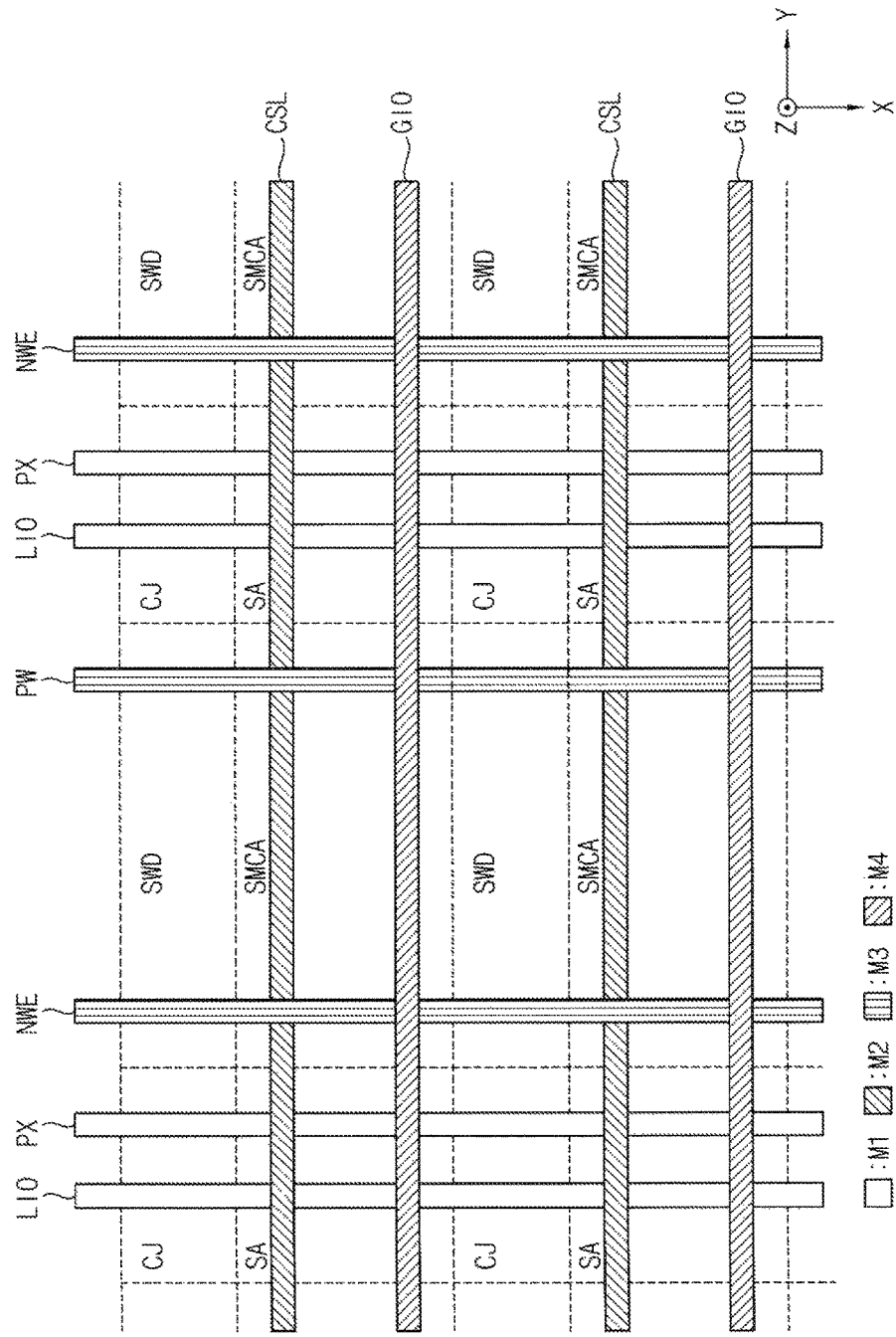

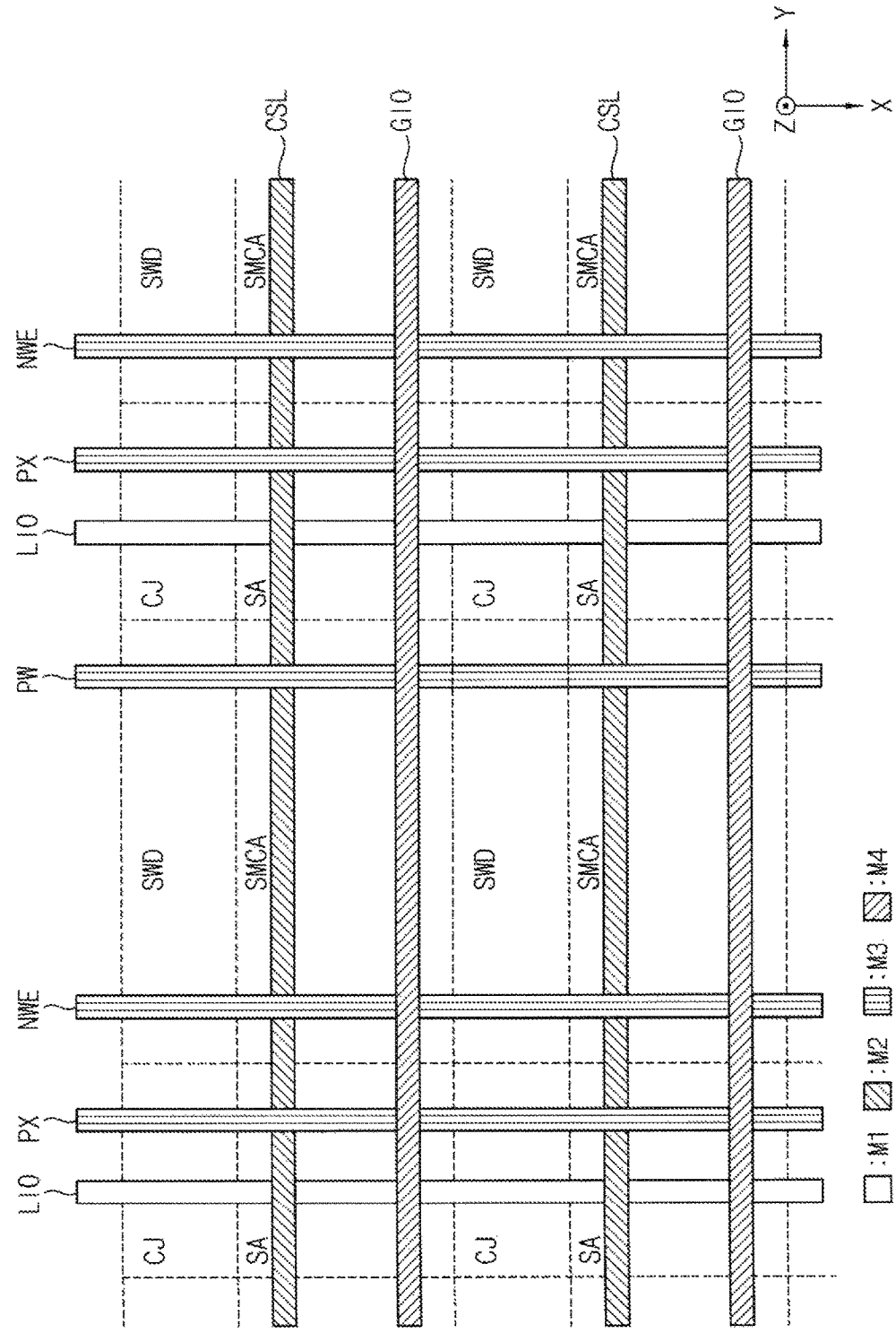

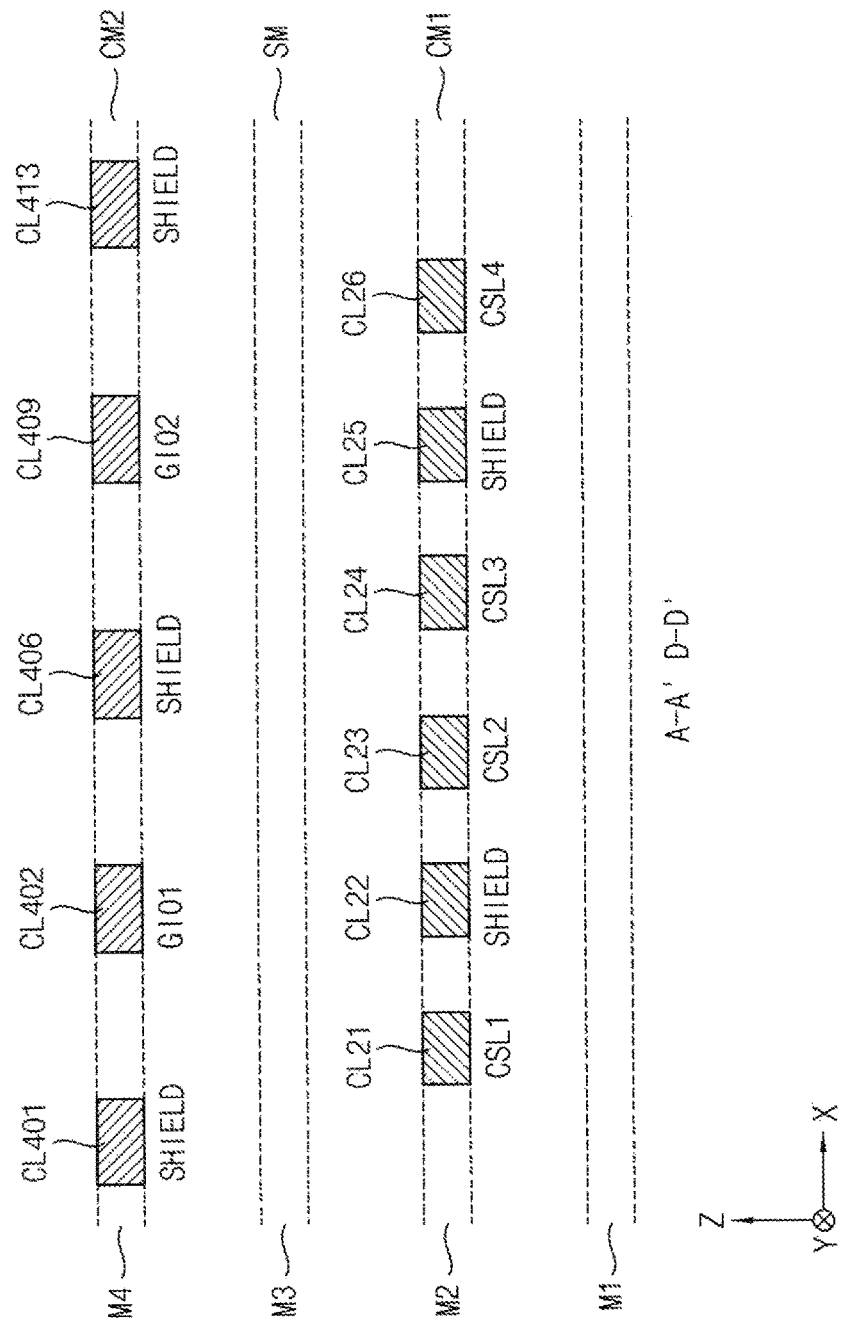

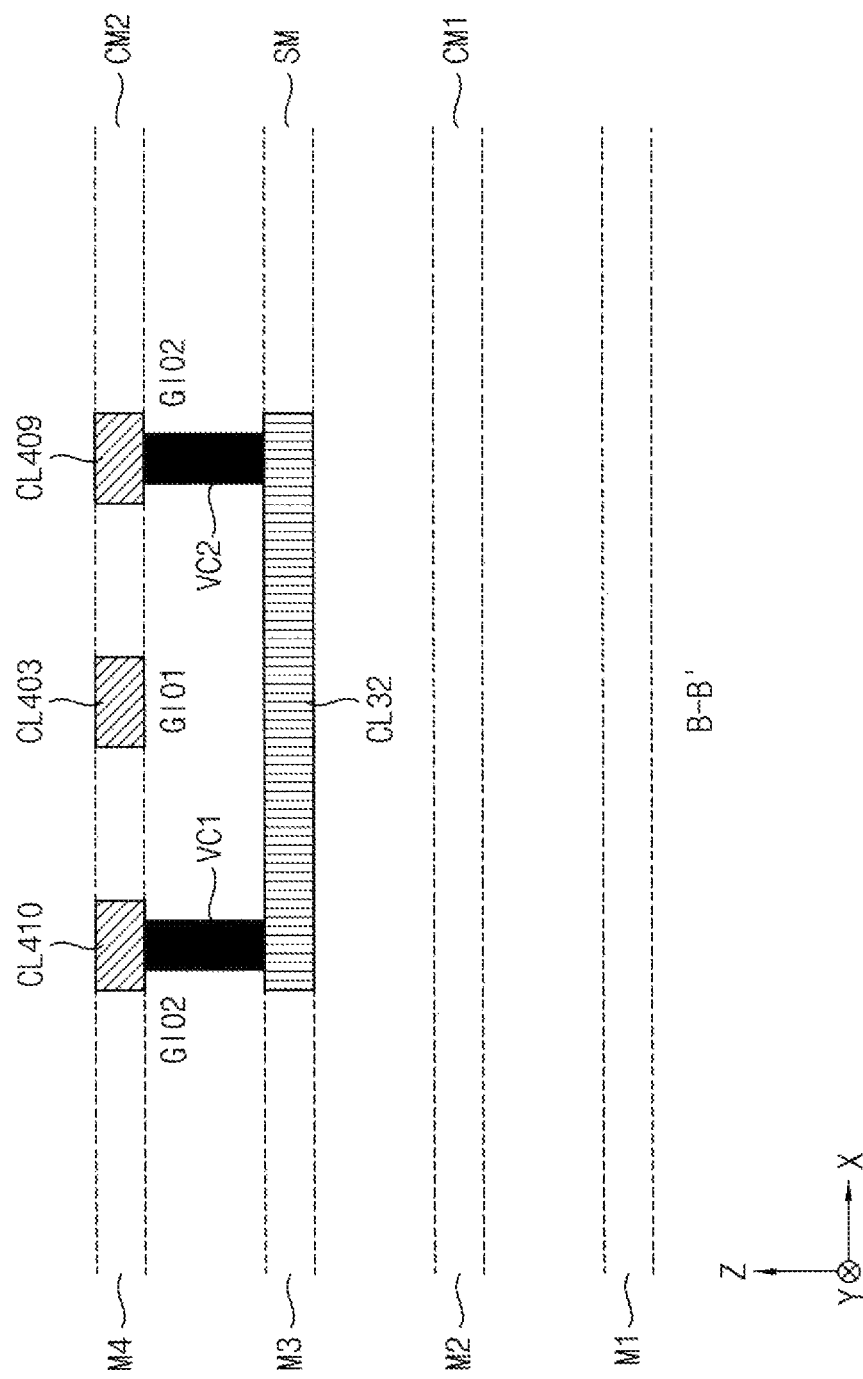

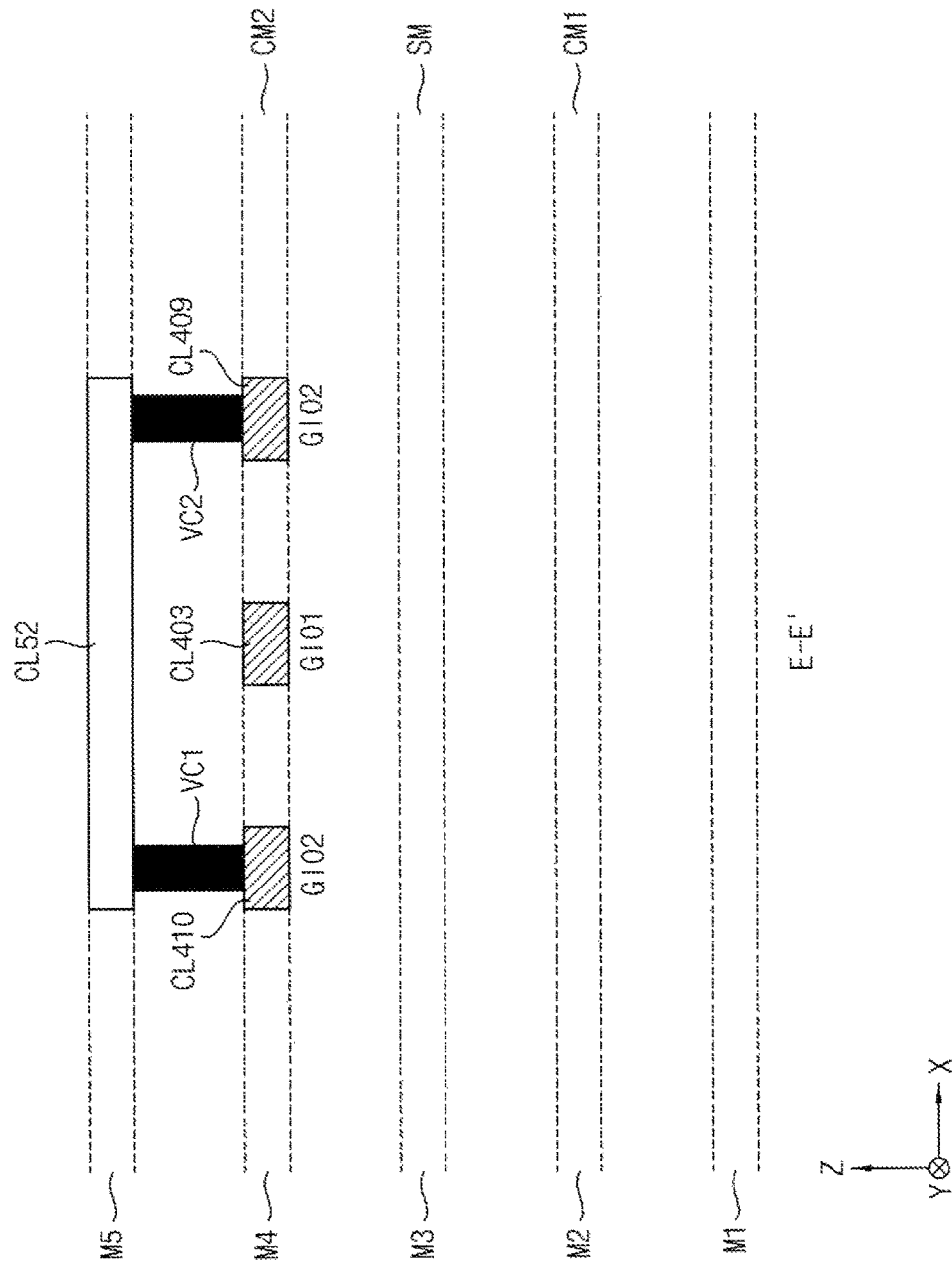

MEMORY DEVICE AND METHOD OF DISPOSING CONDUCTION LINES OF THE SAME

CROSS-REFERENCE TO RELATED APPLICATION

This U.S. Non-provisional application claims priority under 35 USC § 119 to Korean Patent Application No. 10-2016-0172242, filed on Dec. 16, 2016, in the Korean Intellectual Property Office (KIPO), the disclosure of which is incorporated by reference in its entirety herein.

BACKGROUND

1. Technical Field

Example embodiments relate generally to semiconductor integrated circuits, and more particularly to a memory device and a method of disposing conduction lines of a memory device.

2. Discussion of the Related Art

In general, a semiconductor memory device may include a memory cell array region and a peripheral region and the two regions may be designed to use different power supply voltages. Many signal lines and power lines may be arranged in an upper portion of the memory cell array region. The power lines may be disposed in a form of mesh, and power may be provided stably as the mesh of the power lines is compact. It may be difficult to dispose the signal lines and the power lines as integration degree of the memory device is increased.

SUMMARY

Some example embodiments may provide a memory device and a method of disposing conduction lines of the memory device, capable of efficiently disposing signal lines and power lines.

According to example embodiments, a memory device including a memory cell array region, includes, column selection signal lines formed in a first column conduction layer of the memory cell array region and extending in a column direction, global input-output data lines formed in a second column conduction layer of the memory cell array region different from the first column conduction layer and extending in the column direction and power lines formed in a shield conduction layer of the memory cell array region between the first column conduction layer and the second column conduction layer.

According to example embodiments, a memory device including a memory cell array region, includes, local input-output data lines formed in a first conduction layer of the memory cell array region and extending in a row direction, column selection signal lines formed in a second conduction layer of the memory cell array region different from the first conduction layer of the memory cell array region over the second conduction layer and extending in a column direction perpendicular to the row direction, power lines formed in a third conduction layer of the memory cell array region over the second conduction layer and global input-output data lines formed in a fourth conduction layer of the memory cell array region over the third conduction layer and extending in the column direction.

According to example embodiments, a memory device including a memory cell array region, includes, a dual wordline structure including at least one main wordline and a plurality of sub wordlines, a conjunction region, a sub wordline driver region, a sense amplifier region, and a sub memory cell array region, the at least one main wordline extending in a row direction on the sub memory cell array region and the sub wordline driver region; a word selection signal line and a local input-output data line extending in the row direction on the conjunction region and the sense amplifier region; and a column selection signal line and a global input-output data line extending in a column direction perpendicular to the row direction on the sense amplifier region and the sub memory cell array region.

According to example embodiments, a method of disposing conduction lines of a memory device including a memory cell array region, includes, forming column selection signal lines extending in a column direction in a first column conduction layer of the memory cell array region, forming global input-output data lines extending in the column direction in a second column conduction layer of the memory cell array region different from the first column conduction layer of the memory cell array region and forming power lines in a shield conduction layer of the memory cell array region between the first column conduction layer and the second column conduction layer.

The memory device and the associated method according to example embodiments may reduce noises in the signal lines and the power lines and enhance performance of the memory device by forming the column selection signal lines and the global input-output data lines in different column conduction layers and forming the power lines in the shield conduction layer between the column conduction layers.

BRIEF DESCRIPTION OF THE DRAWINGS

Example embodiments of the present disclosure will be more clearly understood from the following detailed description taken in conjunction with the accompanying drawings.

FIGS. 8A, 8B and 8C are diagrams illustrating disposition structures of conduction lines according to example embodiments.

FIGS. 11A, 11B and 11C are cross-sectional diagrams illustrating the distribution structure of the conduction lines of FIG. 10.

FIG. 13 is a cross-sectional diagram illustrating the distribution structure of the conduction lines of FIG. 12.

DETAILED DESCRIPTION OF THE EMBODIMENTS

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present.

As used herein, and unless indicated otherwise, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) that does not permit electric current to pass therethrough is not electrically connected to that component.

Figure 1:
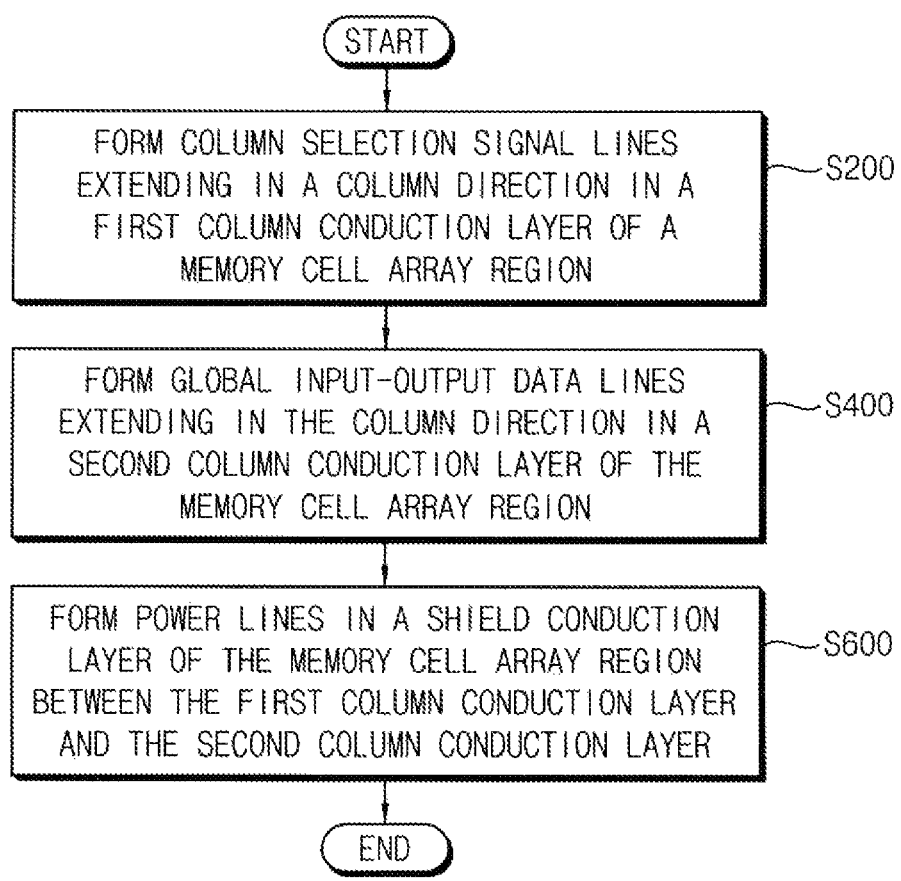
FIG. 1 is a flow chart illustrating a method of disposing conduction lines of a memory device according to example embodiments.
Figure 2:
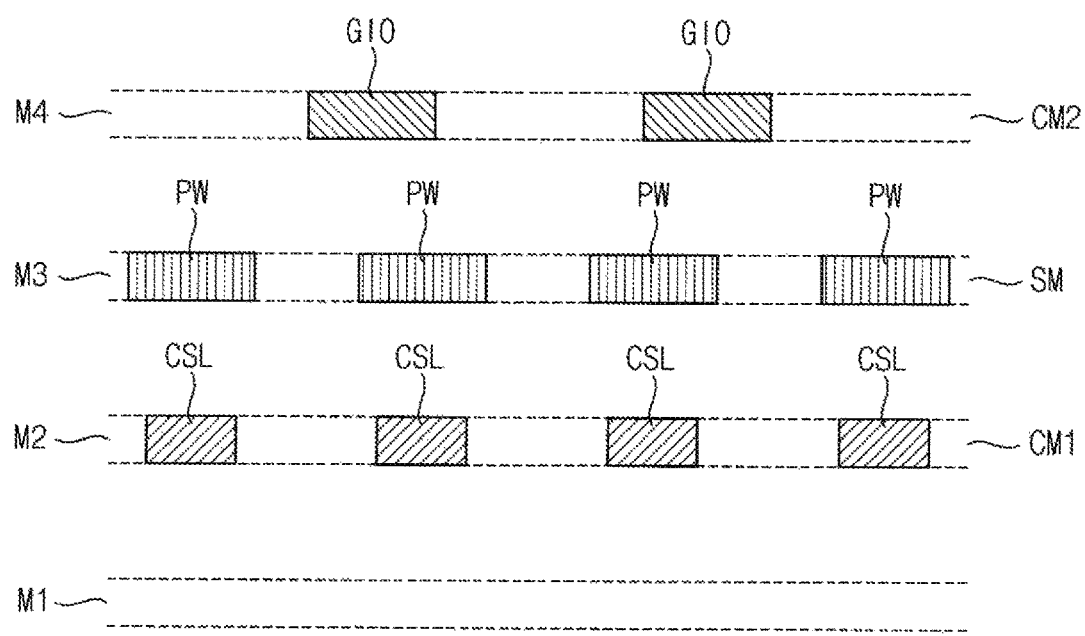
FIG. 2 is a diagram illustrating a disposition structure of conduction lines according to example embodiments.

FIG. 1 is a flow chart illustrating a method of disposing conduction lines of a memory device according to example embodiments, and FIG. 2 is a diagram illustrating a disposition structure of conduction lines according to example embodiments. FIG. 2 illustrates an cross-sectional view a of a memory cell array region of a memory device that is cut along a row direction X. The memory cell array region will be further described below with reference to FIGS. 3 and 4.

Hereinafter, disposition structures of conduction lines are described using a first direction X, a second direction Y and a third direction Z that are perpendicular to one another in a three-dimensional space. The first direction X corresponds to a row direction, the second direction Y corresponds to a column direction and the third direction corresponds to a vertical direction.

Referring to FIGS. 1 and 2, column selection signal lines CSL are formed in a first column conduction layer CM1 of the memory cell array region such that the column selection signal lines CSL extend in a column direction Y (S200). Global input-output data lines GIO are formed in a second column conduction layer CM2 of the memory cell array region different from the first column conduction layer CM2 (e.g., the first column conduction layer CM1 and the second column conduction layer CM2 may be located at a different spatial locations) such that the global input-output data lines GIO extend in the column direction Y (S400). Power lines PW are formed in a shield conduction layer SM of the memory cell array region between the first column conduction layer CM1 and the second column conduction layer CM2 (S600). The power lines PW are lines connected to a terminal of an integrated circuit and/or a transistor that uses a power (e.g., voltage) for operation. During active operation, the power lines may provide a constant source of power, such as Vdd, Vss, Vbb, that may be positive, ground or negative potential, and may be connected to a power supply circuit, such as an internal power supply circuit of a semiconductor chip in which the power lines PW are formed as part of an integrated circuit of the semiconductor chip.

In some example embodiments, the power lines PW in the shield conduction layer SM may extend in the column direction Y. In other example embodiments, the power lines PW in the shield conduction layer SM may extend in the row direction X perpendicular to the column direction Y.

For example, as illustrated in FIG. 2, a first conduction layer M1, a second conduction layer M2, a third conduction layer M3 and a fourth conduction layer M4 may be formed sequentially in the vertical direction Z in the memory cell array region. The first column conduction layer CM1 may correspond to the second conduction layer M2, the shield conduction layer SM may correspond to the third conduction layer M3 and the second column conduction layer CM2 may correspond to the fourth conduction layer M4. The conduction lines that may be formed in the first conduction layer M1 are omitted in FIG. 2. As will be described below, local input-output data lines, main wordlines, word selection signal lines, other power lines, etc. may be formed in the first conduction layer M1. For example, the power lines extending in the row direction X may be formed in the first conduction layer M1 and disposed between the local input-output data lines, the main wordlines and word selection signal lines. The first, second, third and fourth conduction layers M1, M2, M3 and M4 may be formed in that sequence with no other conduction layers formed therebetween. Thus, no conduction layers may be interposed between M1 and M2, M2 and M3, and M3 and M4 (although it will be appreciated that vertically extending conductive vias may extend in locations between the immediately neighboring conduction layers).

The exemplary embodiment of FIG. 2 illustrates only the power lines PW formed in the shield conduction layer SM, but this configuration of power lines PW is not limited thereto. In some example embodiments, other power lines may be formed also in the first column conduction layer CM1 and/or the second column conduction layer CM2. In some example embodiments, the power lines extending in the column direction Y may be formed in the first column conduction layer CM1 and disposed between the column selection signal lines CSL. In other example embodiments, the power lines may be formed in the second column conduction layer CM2 and disposed between the global input-output data lines GIO. The power lines that are formed as such may form a power mesh to provide stable power. In addition, the power lines may perform a function of electromagnetic shield between signal lines.

According to example embodiments, one or more conduction layer may be further formed below the first conduction layer M1 and/or over the fourth conduction layer M4. The first through fourth conduction layer M1~M4 may be metal layers in which metal lines are patterned and the first through fourth conduction layer M1~M4 may be differentiated from a polysilicon layer in which conduction lines of polysilicon are patterned. According to example embodiments, the second column conduction layer CM2 may be disposed below the first column conduction layer CM1, and a plurality of conduction layers may be disposed between the first column conduction layer CM1 and the second column conduction layer CM2.

As such, the memory device and the method of disposing conduction lines of the memory device according to example embodiments may reduce noises in the signal lines and the power lines and enhance performance of the memory device by forming the column selection signal lines and the global input-output data lines in different column conduction layers and forming the power lines in the shield conduction layer between the column conduction layers.

Hereinafter, examples of a memory device are described with reference to FIGS. 3, 4 and 5, but a configuration and a layout of a memory device according to example embodiments are not limited thereto.

Figure 3:
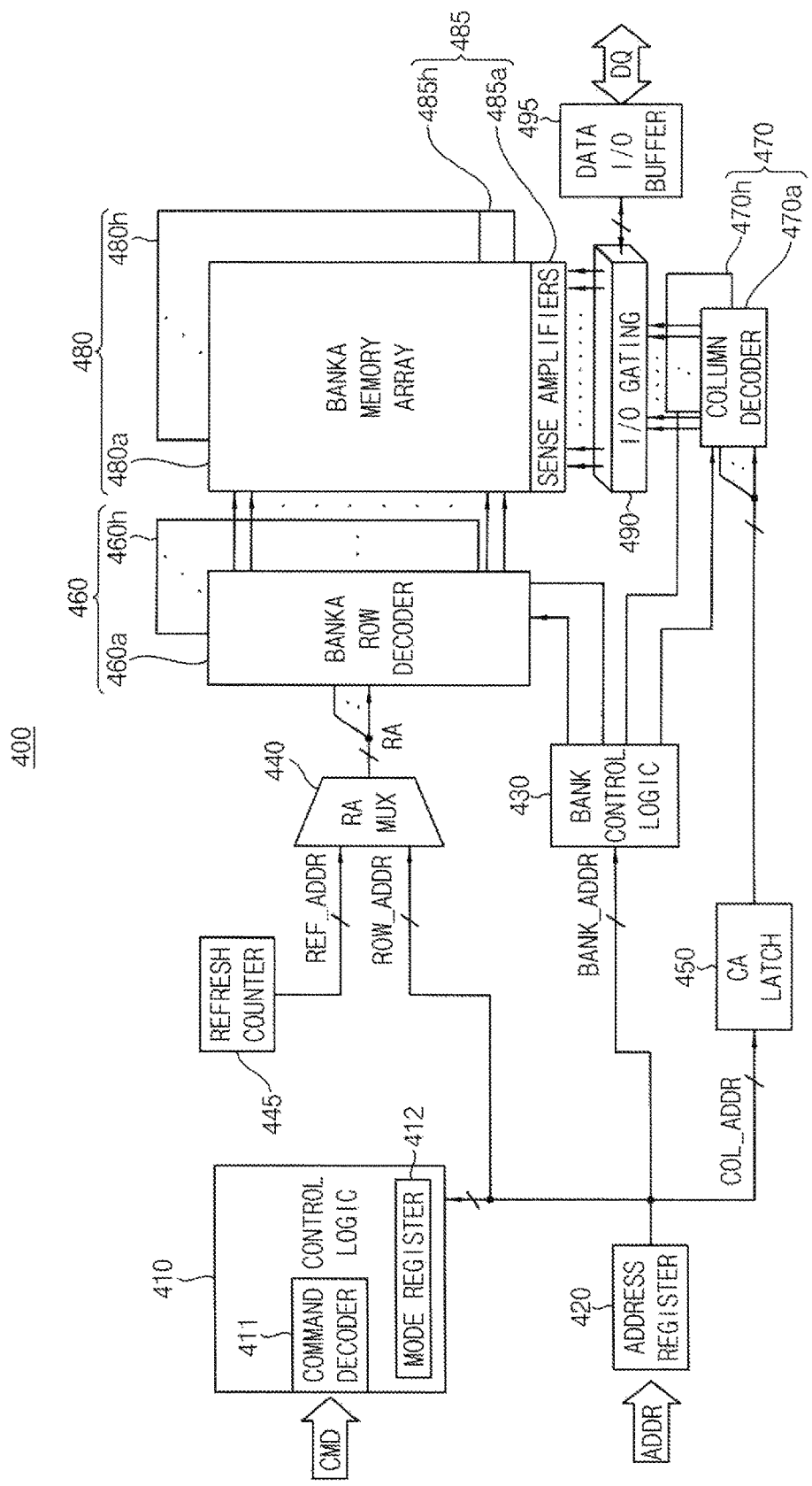
FIG. 3 is a block diagram illustrating a memory device according to example embodiments.

FIG. 3 is a block diagram illustrating a memory device according to example embodiments.

Referring to FIG. 3, an internal circuit that may correspond to a memory region 400 or a memory device 400. The memory region 400 (or, alternatively, the memory device) may include a control logic 410, an address register 420, a bank control logic 430, a row address multiplexer 440, a column address latch 450, a row decoder 460, a column decoder 470, a memory cell array 480, a sense amplifier unit 485, an input/output (I/O) gating circuit 490, a data input/output (I/O) buffer 495, and a refresh counter 445.

The memory cell array 480 may include a plurality of bank arrays 480a~480h. The row decoder 460 may include a plurality of bank row decoders 460a~460h respectively coupled to the bank arrays 480a~480h, the column decoder 470 may include a plurality of bank column decoders 470a~470h respectively coupled to the bank arrays 480a~480h, and the sense amplifier unit 485 may include a plurality of bank sense amplifiers 485a~485h respectively coupled to the bank arrays 480a~480h.

The address register 420 may receive an address ADDR including a bank address BANK_ADDR, a row address ROW_ADDR and a column address COL_ADDR from a memory controller (not shown). The address register 420 may provide the received bank address BANK_ADDR to the bank control logic 430, may provide the received row address ROW_ADDR to the row address multiplexer 440, and may provide the received column address COL_ADDR to the column address latch 450.

The bank control logic 430 may generate bank control signals in response to the bank address BANK_ADDR. One of the bank row decoders 460a~460h corresponding to the bank address BANK_ADDR may be activated in response to the bank control signals, and one of the bank column decoders 470a~470h corresponding to the bank address BANK_ADDR may be activated in response to the bank control signals.

The row address multiplexer 440 may receive the row address ROW_ADDR from the address register 420, and may receive a refresh row address REF_ADDR from the refresh counter 445. The row address multiplexer 440 may selectively output the row address ROW_ADDR or the refresh row address REF_ADDR as a row address RA. The row address RA that is output from the row address multiplexer 440 may be applied to the bank row decoders 460a~460h.

The activated one of the bank row decoders 460a~460h may decode the row address RA that is output from the row address multiplexer 440, and may activate a word-line corresponding to the row address RA. For example, the activated bank row decoder may apply a word-line driving voltage to the word-line corresponding to the row address RA.

The column address latch 450 may receive the column address COL_ADDR from the address register 420, and may temporarily store the received column address COL_ADDR. In some embodiments, in a burst mode, the column address latch 450 may generate column addresses that increment from the received column address COL_ADDR. The column address latch 450 may apply the temporarily stored or generated column address to the bank column decoders 470a~470h.

The activated one of the bank column decoders 470a~470h may decode the column address COL_ADDR that is output from the column address latch 450, and may control the input/output gating circuit 490 in order to output data corresponding to the column address COL_ADDR.

The I/O gating circuit 490 may include a circuitry for gating input/output data. The I/O gating circuit 490 may further include read data latches for storing data that is output from the bank arrays 480a~480h, and write drivers for writing data to the bank arrays 480a~480h.

Data to be read from one bank array of the bank arrays 480a~480h may be sensed by the sense amplifier unit 485 coupled to the one bank array from which the data is to be read, and may be stored in the read data latches. The data stored in the read data latches may be provided to the memory controller via the data I/O buffer 495. Data DQ to be written in one bank array of the bank arrays 480a~480h may be provided to the data I/O buffer 495 from the memory controller. The write driver may write the data DQ in one bank array of the bank arrays 480a~480h.

The control logic 410 may control operations of the memory region 400. For example, the control logic 410 may generate control signals for the memory region 400 in order to perform a write operation or a read operation. The control logic 410 may include a command decoder 411 that decodes a command CMD received from the memory controller and a mode register set 412 that sets an operation mode of the memory region 400.

For example, the command decoder 411 may generate the control signals corresponding to the command CMD by decoding a write enable signal, a row address strobe signal, a column address strobe signal, a chip selection signal, etc.

Figure 4:
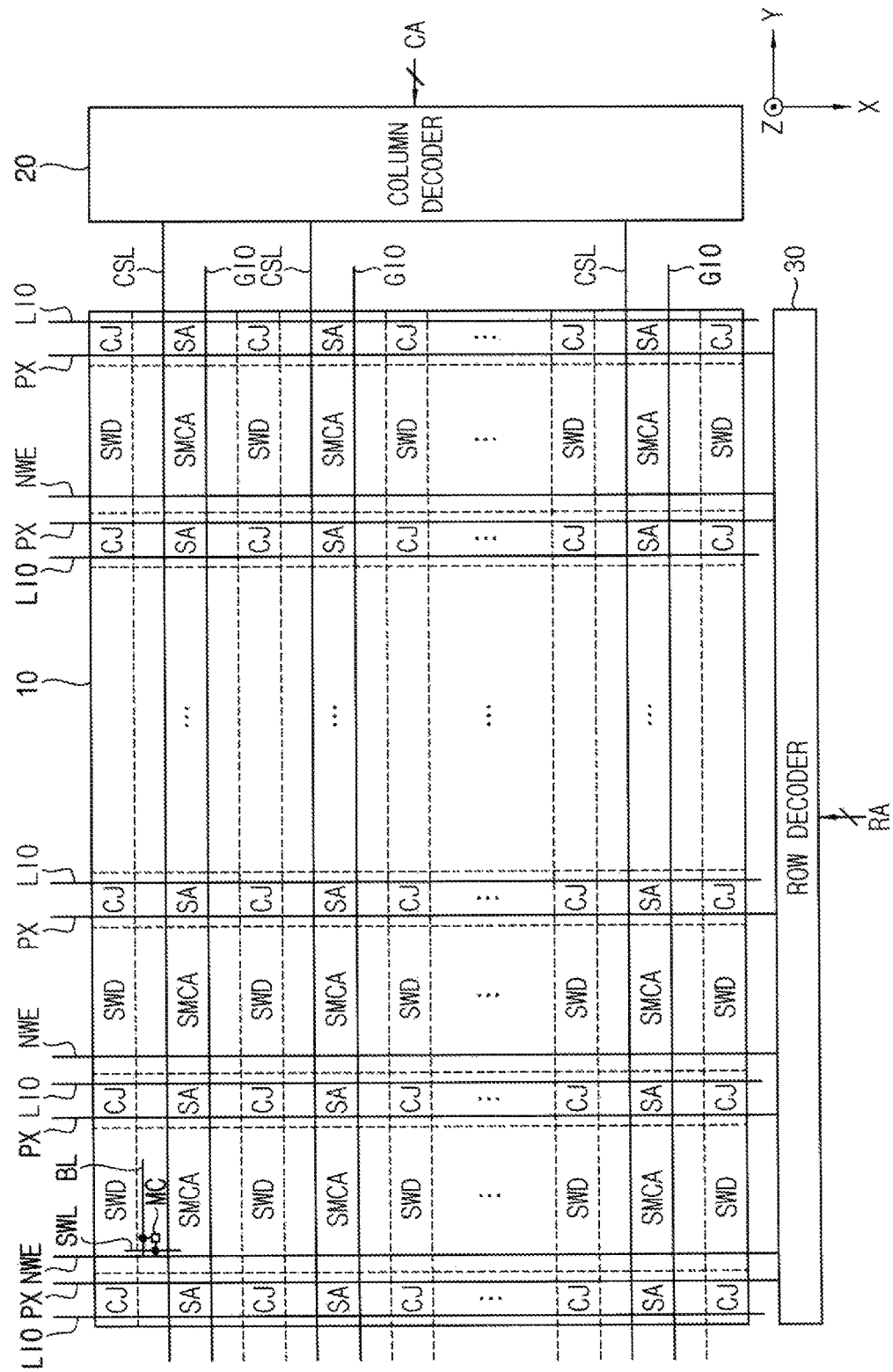
FIG. 4 is a diagram illustrating an example layout of a memory cell array region included in the memory device of FIG. 3.

FIG. 4 is a diagram illustrating an example layout of a memory cell array included in the memory device of FIG. 3.

FIG. 4 illustrates a memory cell array region 10, a column decoder 20, and a row decoder 30 and other components of the memory device of FIG. 3 are omitted for convenience of illustration. The memory cell array region 10, the column decoder 20, and the row decoder 30 illustrated in FIG. 4 respectively correspond to the memory cell array 480, the column decoder 470, and the row decoder 460 illustrated in FIG. 3. The memory cell array region 10 includes a dual wordline structure including a main wordline NWE and a plurality of sub wordlines SWL, conjunction regions CJ, sub wordline driver regions SWD, sense amplifier regions SA and sub memory cell array regions SMCA. According to example embodiments, the main wordlines NWE are formed in the shield conduction layer SM and extend in the row direction X on the sub memory cell array regions SMCA and the sub wordline driver regions SWD. The memory cell array region 10 may also include a plurality of sub wordline drivers on the sub wordline driver regions SWD each driving a corresponding one of the sub wordline SWL. The sub wordlines SWL may be selected in response to signals transferred through the word selection signal lines PX and the main wordlines NWE. The plurality of sub wordlines SWL may be formed in a polysilicon layer of the memory cell array region 10 and one or more wordline connection lines formed in a metal layer over the polysilicon layer to cross the sub wordline driver regions SWD and each wordline connection line connecting through vertical contacts, as described below, a pair of sub wordlines of the plurality of sub wordlines SWL that are disposed at both sides of the sub wordline driving regions SWD.

In some embodiments, word selection signal lines PX, main wordlines NWE, sub wordlines SWL, column selection signal lines CSL, local input-output data lines LIO and global input-output data lines GIO may be formed in an upper portion of the memory cell array region 10. The power lines are omitted in FIG. 4 for convenience of illustration.

In the memory cell array region 10, the conjunction regions CJ, the sub wordline driver regions SWD, the sense amplifier regions SA and the sub memory cell array regions SMCA are disposed repeatedly in the row direction X and the column direction Y. The memory cells MC are formed in the sub memory cell array regions SMCA and connected to the sub wordlines SWL and the bitlines BL. The data may be written to or read from the memory cells MC in response to the signals transferred through the word selection signal lines PX, the main wordlines NWE and the column selection signal lines CSL.

The column decoder 20 generates signals on column select signal lines CSL to select one or more columns of the array for reading or writing according to a supplied column address CA. The row decoder 30 decodes the row address RA to generate signals for selecting one of the main wordlines NWE and signals for selecting one of the word line selection lines PX.

The main wordlines NWE extend in the row direction X on the sub wordline driver regions SWD and the sub memory cell array regions SMCA, and the word selection signal lines PX and the local input-output data lines LIO extend in the row direction X on the conjunction regions CJ and the sense amplifier regions SA. The column selection signal lines CSL and the global input-output data lines GIO extend in the column direction Y on the sense amplifier regions SA and the sub memory cell array regions SMCA.

Figure 5:
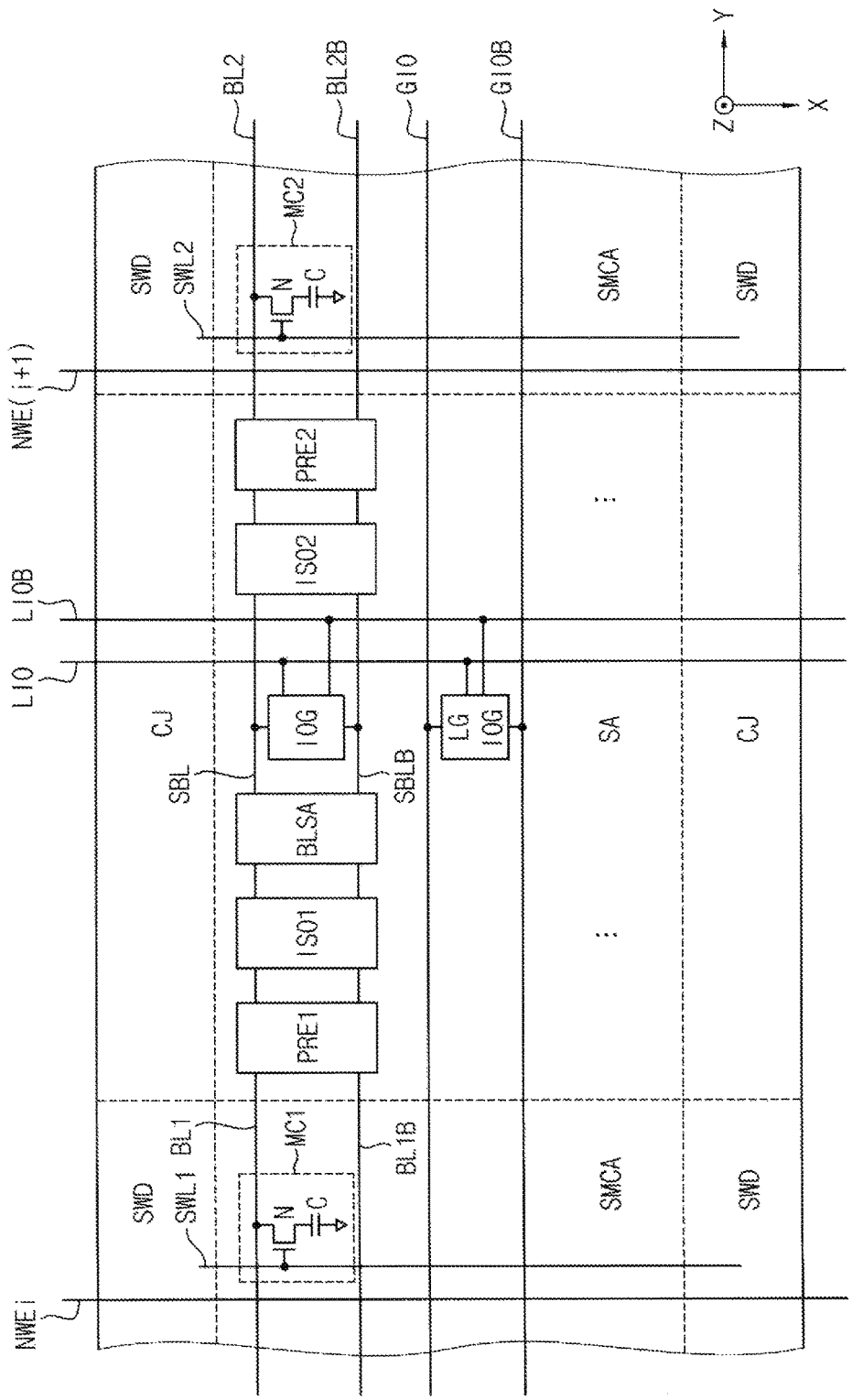
FIG. 5 is a diagram illustrating an example of a sub memory cell array region and a sense amplifier region included in the memory cell array region of FIG. 5.

FIG. 5 is a diagram illustrating an example of a sub memory cell array region and a sense amplifier region included in the memory cell array region of FIG. 5.

FIG. 5 illustrates an example embodiment with signal and power lines routed over a memory cell array region. For convenience of illustration, configuration of the one sense amplifier region SA corresponding to a pair of bitlines BL and BLB is illustrated in FIG. 5.

In FIG. 5, MC1, NWEi, SWL1, BL1 and BL1B represent a memory cell, a main wordline, a sub wordline and a bitline pair that are disposed at a left portion of FIG. 5 and MC2, NWE(i+1), SWL2, BL2 and BL2B represent a memory cell, a main wordline, a sub wordline and a bitline pair that are disposed at a right portion of FIG. 5. SBL, SBLB represent a sense bitline pair connecting BL1 and BL1B to BL2 and BL2B. PRE1 and PRE2 represent precharge circuits, ISO1 and ISO2 represent bitline isolation gates, BLSA represents bitline sense amplifiers, IOG represents data input-output gates, LGIOG represents local global input-output gates. Each of the memory cells MC1 and MC2 may be a DRAM cell including one NMOS transistor N and one capacitor C that is connected to each of the sub wordlines SWL1 and SWL2 and each of the bitline pairs BL1/BL1B and BL2/BL2B.

The configuration of the sense amplifier region SA is illustrated in FIG. 5. The precharge circuit PRE1 is disposed to precharge the bitline pair BL1 and BL1B, and the precharge circuit PRE2 is disposed to precharge the bitline pair BL2 and BL2B. The bitline isolation gate IS01 is disposed between the bitline pair BL1 and BL1B and the sense bitline pair SBL and SBLB, and bitline isolation gate ISO2 is disposed between the bitline pair BL2 and BL2B and the sense bitline pair SBL and SBLB. The bitline sense amplifier BLSA is disposed between the sense bitline pair SBL and SBLB to amplify the signal levels of the sense bitline pair SBL and SBLB. The data input-output gate IOG is disposed to transfer data between the sense bitline pair SBL and SBLB and the local input-output data line pair LIO and LIOB. The local global input-output gate LGIOG is disposed to transfer data between the local input-output data line pair LIO and LIOB and the global input-output data line pair GIO and GIOB.

The sub wordlines may be selected in response to signals transferred through the word selection signal lines PX and the main wordlines NWEi and NWE(i+1). Even though not illustrated in FIG. 5, the local input-output data line pair LIO and LIOB may be separated by the predetermined number of sub memory cell array regions arranged in the row direction X.

The method of disposing signal lines and power lines according to example embodiments may be applied to a DRAM device that has a configuration as illustrated in FIG. 5 but is not limited thereto. For example, even though FIG. 5 illustrates that the global input-output data lines GIO are disposed on the sense amplifier regions SA and the sub memory cell array regions SMCA, they may be disposed on the conjunction regions CJ and the sub wordline driver regions SWD. If the global input-output data lines GIO are disposed on the conjunction regions CJ and the sub wordline driver regions SWD, the local global input-output gate LGIOG may be disposed on the conjunction regions CJ.

Hereinafter the method of disposing conduction lines according to example embodiments are described and the descriptions repeated with the descriptions of FIG. 3 through 5 may be omitted.

Figure 6:
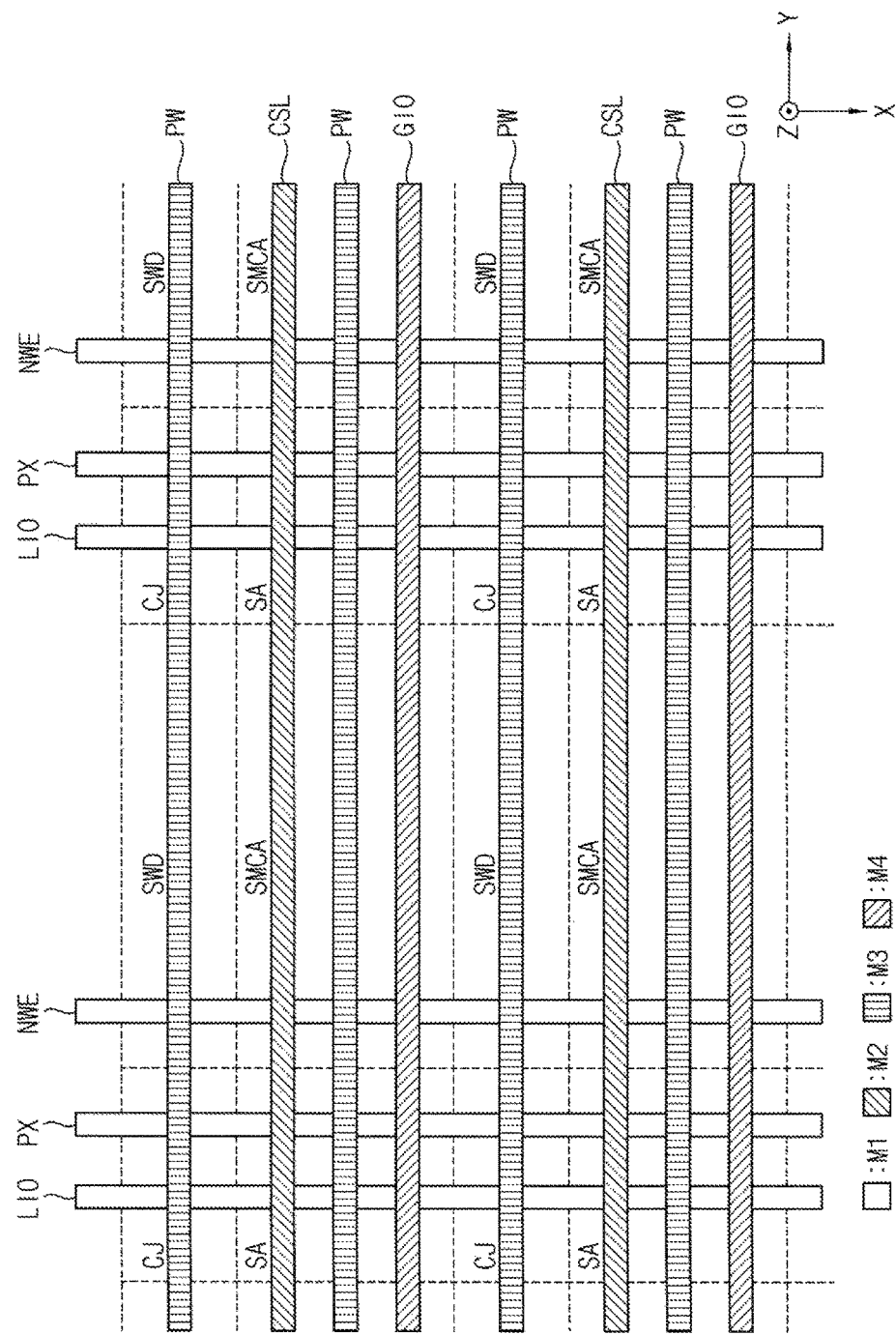
FIG. 6 is a diagram illustrating a disposition structure of conduction lines according to example embodiments.
Figure 7:
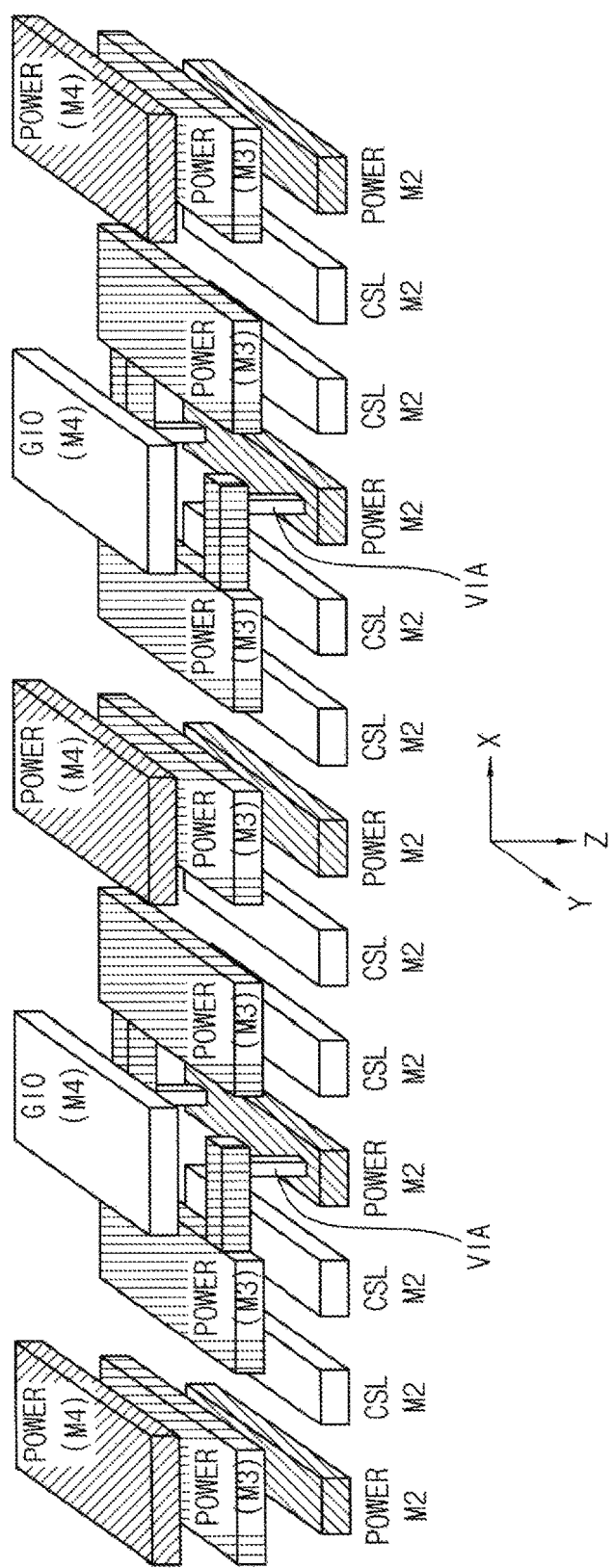
FIG. 7 is a perspective view of an example distribution structure of the conduction lines of FIG. 6.

FIG. 6 is a diagram illustrating a disposition structure of conduction lines according to example embodiments, and FIG. 7 is a perspective view of an example distribution structure of the conduction lines of FIG. 6.

FIG. 6 illustrates conduction lines disposed in a first conduction layer M1, a second conduction layer M2, a third conduction layer M3 and a fourth conduction layer M4. As illustrated in FIG. 6, the conduction lines in the first conduction layer M1 may extend in the row direction X and the conduction lines disposed in the second, third and fourth conduction layers M2, M3 and M4 may extend in column direction Y. Such structure may be referred to as one-row and three-column (1R-3C) structure.

FIG. 6 is for representing a vertical structure of conduction lines and does not define a detailed disposition structure of the conduction lines. For example, the one conduction line in FIG. 6 may represent a plurality of conduction lines of the same kind. Even though the power lines PW in the third conduction layer M3 is illustrated in FIG. 6 for convenience of illustration, the other power lines may be disposed in the other conduction layers.

Referring to FIG. 6, the local input-output data lines LIO, the word selection signal lines PX and the main wordlines NWE extending in the row direction X may be formed in the first conduction layer M1. The column selection signal lines CSL extending in the column direction Y may be formed in the second conduction layer M2 corresponding to the first column conduction layer CM1. The power lines PW extending in the column direction Y may be formed in the third conduction layer M3 corresponding to the shield conduction layer SM. The global input-output data lines GIO extending in the column direction Y may be formed in the fourth conduction layer M4 corresponding to the second column conduction layer CM2.

FIG. 7 illustrates an example distribution structure of conduction lines corresponding to a memory cell array region. Referring to FIG. 7, the column selection signal lines CSL extending in the column direction Y may be formed in the second conduction layer M2 corresponding to the first column conduction layer CM1, and the global input-output data lines GIO extending in the column direction Y may be formed in the fourth conduction layer M4 corresponding to the second column conduction layer CM2 of the memory cell array region. The power lines POWER may be formed in the third conduction layer M3 corresponding to the shield conduction layer SM of the memory cell array region between the second conduction layer M2 corresponding to the first column conduction layer CM1 and the fourth conduction layer M4 corresponding to the second column conduction layer CM2. The power lines POWER in the shield conduction layer M3 may reduce coupling noises between the global input-output data lines GIO and the column selection signal lines CSL.

Some power lines POWER extending in the column direction Y may be formed in the second conduction layer M2 corresponding to the first column conduction layer CM1 and disposed between the column selection signal lines CSL. In addition, some power lines POWER extending in the column direction Y may be formed in the fourth conduction layer M4 corresponding to the second column conduction layer CM2 and disposed between global input-output data lines GIO. The power lines POWER formed in the second conduction layer M2 corresponding to the first column conduction layer CM1 may reduce coupling noises between the column selection signal lines CSL and the power lines POWER formed in the fourth conduction layer M4 corresponding to the second column conduction layer CM2 may reduce coupling noises between the global input-output data lines GIO.

If the power lines in the different conduction layers provide the same voltage, the power lines may be connected through via contacts VIA to form a power mesh as illustrated in FIG. 7. The compact power mesh may provide stable power to the memory cell array region.

As such, the column selection signal lines CSL and the global input-output data lines GIO may be formed in the different conduction layers and the power lines PW may be formed in the conduction layer between the conduction layers of the column selection signal lines CSL and the global input-output data lines GIO to reduce noises between signal lines and power lines and enhance performance of a memory device.

Figure 8B:
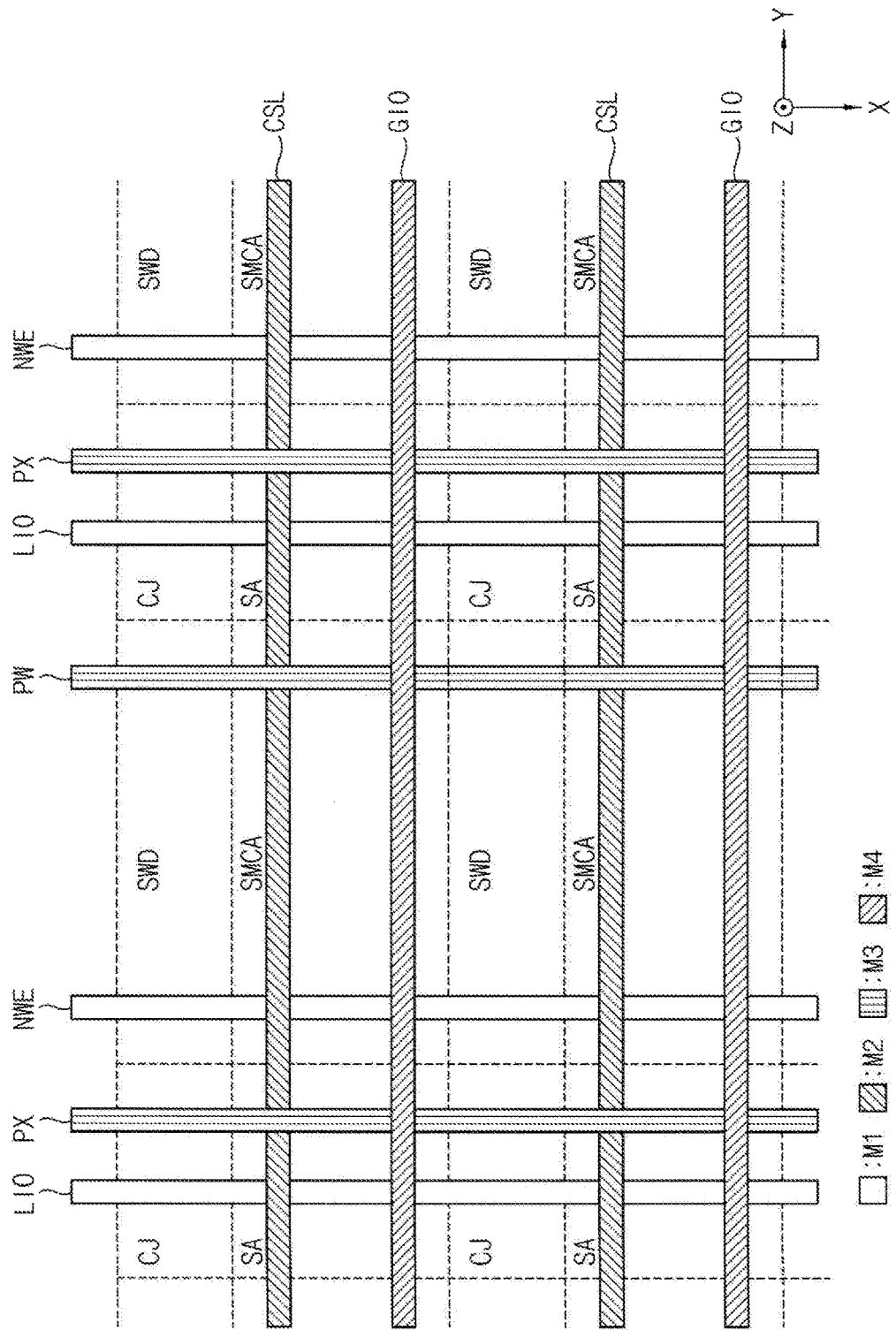

FIGS. 8A, 8B and 8C are diagrams illustrating disposition structures of conduction lines according to example embodiments.

FIGS. 8A, 8B and 8C illustrate conduction lines disposed in a first conduction layer M1, a second conduction layer M2, a third conduction layer M3 and a fourth conduction layer M4. As illustrated in FIGS. 8A, 8B and 8C, the conduction lines in the first and third conduction layers M1 and M3 may extend in the row direction X and the conduction lines disposed in the second and fourth conduction layers M2 and M4 may extend in column direction Y. Such structure may be referred to as two-row and two-column (2R-2C) structure.

FIGS. 8A, 8B and 8C are for representing a vertical structure of conduction lines and does not define a detailed disposition structure of the conduction lines. For example, the one conduction line in FIG. 6 may represent a plurality of conduction lines of the same kind. Even though the power lines PW in the third conduction layer M3 is illustrated in FIGS. 8A, 8B and 8C for convenience of illustration, the other power lines may be disposed in the other conduction layers.

Referring to FIG. 8A, the local input-output data lines LIO and the word selection signal lines PX extending in the row direction X may be formed in the first conduction layer M1. The column selection signal lines CSL extending in the column direction Y may be formed in the second conduction layer M2 corresponding to the first column conduction layer CM1. The power lines PW and the main wordlines NWE extending in the row direction X may be formed in the third conduction layer M3 corresponding to the shield conduction layer SM. The global input-output data lines GIO extending in the column direction Y may be formed in the fourth conduction layer M4 corresponding to the second column conduction layer CM2.

Referring to FIG. 8B, the local input-output data lines LIO and the main wordlines NWE extending in the row direction X may be formed in the first conduction layer M1. The column selection signal lines CSL extending in the column direction Y may be formed in the second conduction layer M2 corresponding to the first column conduction layer CM1. The power lines PW and the word selection signal lines PX extending in the row direction X may be formed in the third conduction layer M3 corresponding to the shield conduction layer SM. The global input-output data lines GIO extending in the column direction Y may be formed in the fourth conduction layer M4 corresponding to the second column conduction layer CM2.

Referring to FIG. 8C, the local input-output data lines LIO extending in the row direction X may be formed in the first conduction layer M1. The column selection signal lines CSL extending in the column direction Y may be formed in the second conduction layer M2 corresponding to the first column conduction layer CM1. The power lines PW, the main wordlines NWE and the word selection signal lines PX extending in the row direction X may be formed in the third conduction layer M3 corresponding to the shield conduction layer SM. The global input-output data lines GIO extending in the column direction Y may be formed in the fourth conduction layer M4 corresponding to the second column conduction layer CM2.

As such, the column selection signal lines CSL and the global input-output data lines GIO may be formed in the different conduction layers and the power lines PW may be formed in the conduction layer between the conduction layers of the column selection signal lines CSL and the global input-output data lines GIO to reduce noises between signal lines and power lines and enhance performance of a memory device.

Figure 9A:
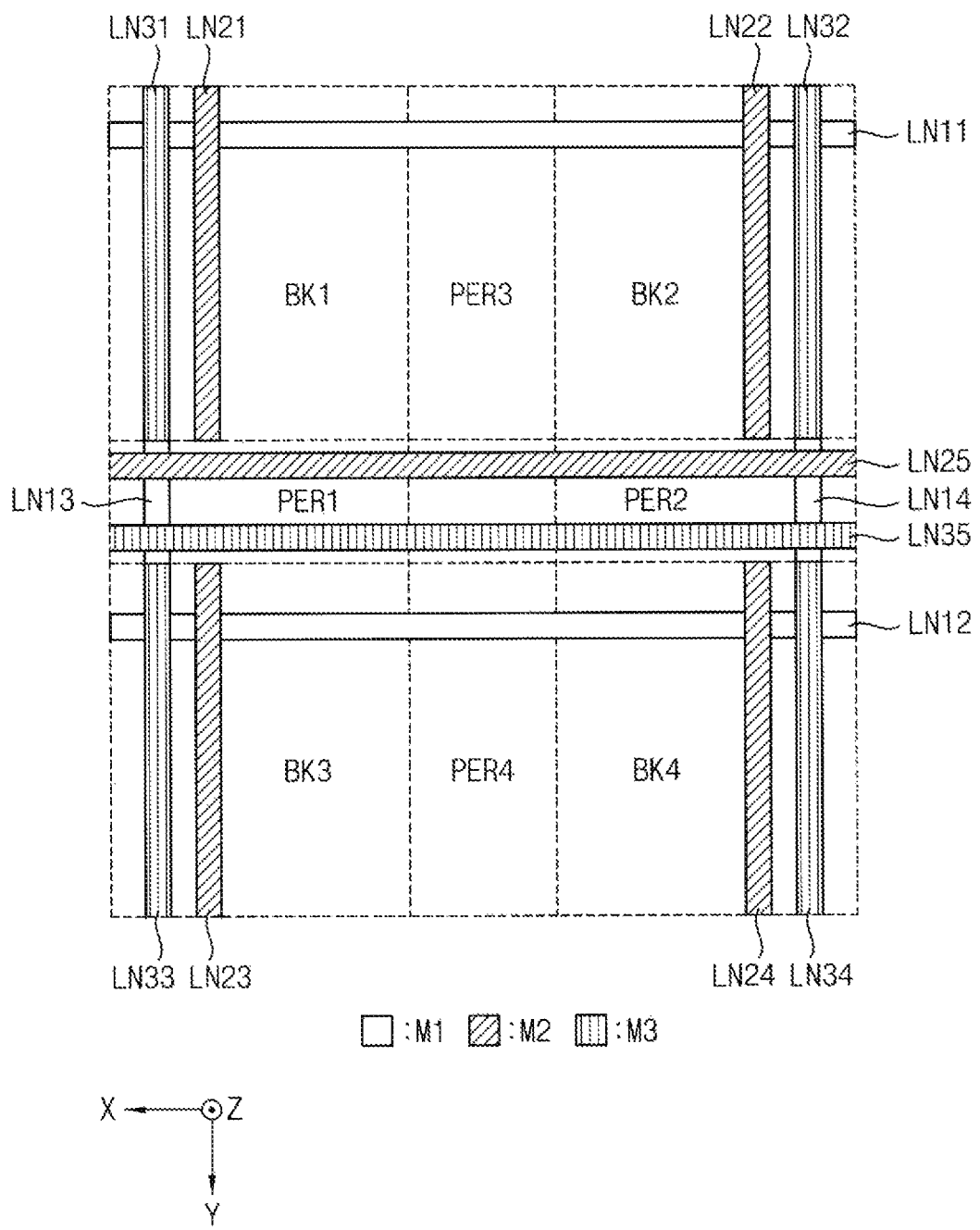
FIGS. 9A and 9B are diagrams for describing disposition structures of conduction lines according to example embodiments.
Figure 9B:
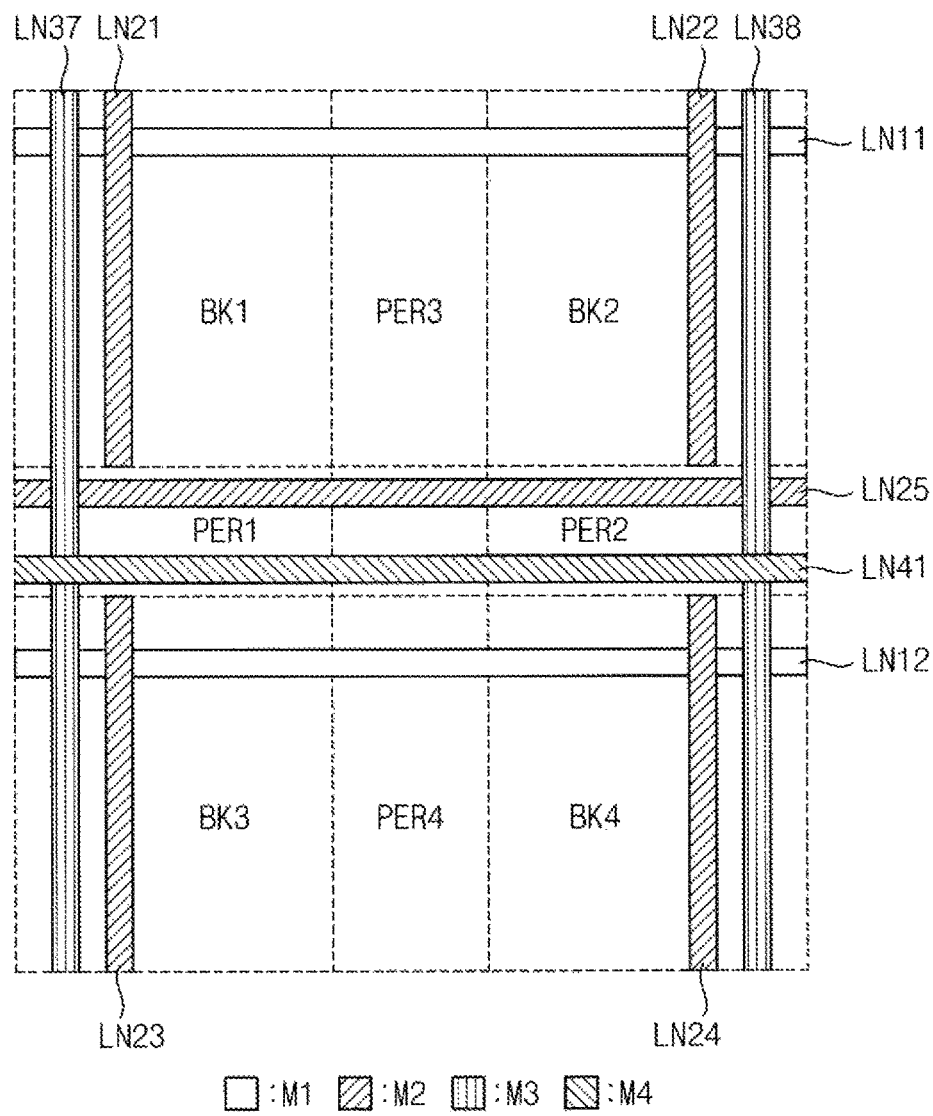

FIGS. 9A and 9B are diagrams for describing disposition structures of conduction lines according to example embodiments.

As described with reference to FIG. 3, the memory cell array may include a plurality of bank arrays BK1~BK4. FIGS. 9A and 9B illustrate a non-limiting example of the four bank arrays BK1~BK4, and the number of the bank arrays may be determined variously.

Referring to FIGS. 9A and 9B, peripheral circuit regions PER1~PER4 may be disposed between the bank arrays BK1~BK4. Various circuits such as the above described row decoder, column decoder, etc. for controlling the bank arrays BK1~BK4 may be formed in the peripheral circuit regions PER1~PER4. In some embodiments, a first peripheral circuit region PER1 may be disposed in a row direction X between a first bank array BK1 and a third bank array BK3 adjacent to the first bank array BK1, a second peripheral circuit region PER2 may be disposed in a row direction X between a second bank array BK2 and a fourth bank array BK4 adjacent to the second bank array BK2, a third peripheral circuit region PER3 may be disposed in a column direction Y between the first bank array BK1 and the second bank array BK2 adjacent to the first bank array BK1, and a fourth peripheral circuit region PER4 may be disposed in a column direction Y between the third bank array BK3 and the fourth bank array BK4 adjacent to the third bank array BK3.

FIG. 9A illustrates a distribution structure of conduction lines using first, second and third conduction layers M1, M2 and M3 and FIG. 9B illustrates a distribution structure of conduction lines using first, second, third and fourth conduction layers M1, M2, M3 and M4.

Referring to FIG. 9A, conduction lines LN11~LN14 are formed in the first conduction layer M1, conduction lines LN21~LN25 are formed in the second conduction layer M2 and conduction lines LN31~LN35 are formed in the third conduction layer M3. Conduction lines LN11 and LN12 formed in the first conduction layer M1 extends in the row direction X and conduction lines LN13 and LN14 formed in the first conduction layer M1 extends in the column direction Y. Conduction lines LN21, LN22, LN23, and LN24 formed in the second conduction layer M2 extends in the column direction Y and conduction line LN25 formed in the second conduction layer M2 extends in the row direction X. Conduction lines LN31, LN32, LN33, and LN34 formed in the third conduction layer M3 extends in the column direction Y and conduction line LN35 formed in the third conduction layer M3 extends in the row direction X. In general, the power lines are designed to penetrate the peripheral circuit region to provide power to the bank arrays. In one embodiment, the power lines may not penetrate the first peripheral circuit region PER1 and the second peripheral circuit region PER2 because of the line LN25 formed in the second conduction line M2 crossing the first and second peripheral circuit regions PER1 and PER2 in the row direction X. To address this issue, the power lines are designed to make a detour using a different conduction layer to provide power to the bank arrays.

For example, in one embodiment, the first through four lines LN31~LN34 extending in the column direction Y in the third conduction layer M3 may be the power lines. The first line LN31 and the third line LN33 may be connected electrically through vertical contacts (not shown) and the line LN13 extending in the column direction Y formed in the first conduction layer M1. In one embodiment, the second line LN32 and the fourth line LV34 may be connected electrically through vertical contacts (not shown) and the line LN14 extending in the column direction Y formed in the first conduction layer M1.

If the segments of the single power line are distributed in a plurality of conduction layers, ohmic drop on the power lines may be increased and power efficiency is degraded.

Referring to FIG. 9B, conduction lines LN11, LN12 are formed in the first conduction layer M1, conduction lines LN21~LN25 are formed in the second conduction layer M2, conduction lines LN37 and LN38 are formed in the third conduction layer M3, and conduction lines LN41 is formed in the fourth conduction layer M4. For example, the first and second lines LN37 and LN38 extending in the column direction Y in the third conduction layer M3 may be the power lines.

In comparison of FIG. 9A, each of the first line LN37 and the second line LN38 in FIG. 9B may be formed in a form of a straight line without using another conduction layer. For example, in one embodiment, the first line LN37 may penetrate the bank arrays BK1 and BK3 adjacent in the column direction Y and the peripheral circuit region PER1 between the adjacent bank arrays BK1 and BK3 in the third conduction layer M3 corresponding to the shield conduction layer SM, without using vertical contacts. In one embodiment, the second line LN38 may penetrate the bank arrays BK2 and BK4 adjacent in the column direction Y and the peripheral circuit region PER2 between the adjacent bank arrays BK2 and BK4 in the third conduction layer M3 corresponding to the shield conduction layer SM, without using vertical contacts. The enhanced power efficiency and characteristics may be provided using such conduction lines LN37 and L38.

Figure 10:
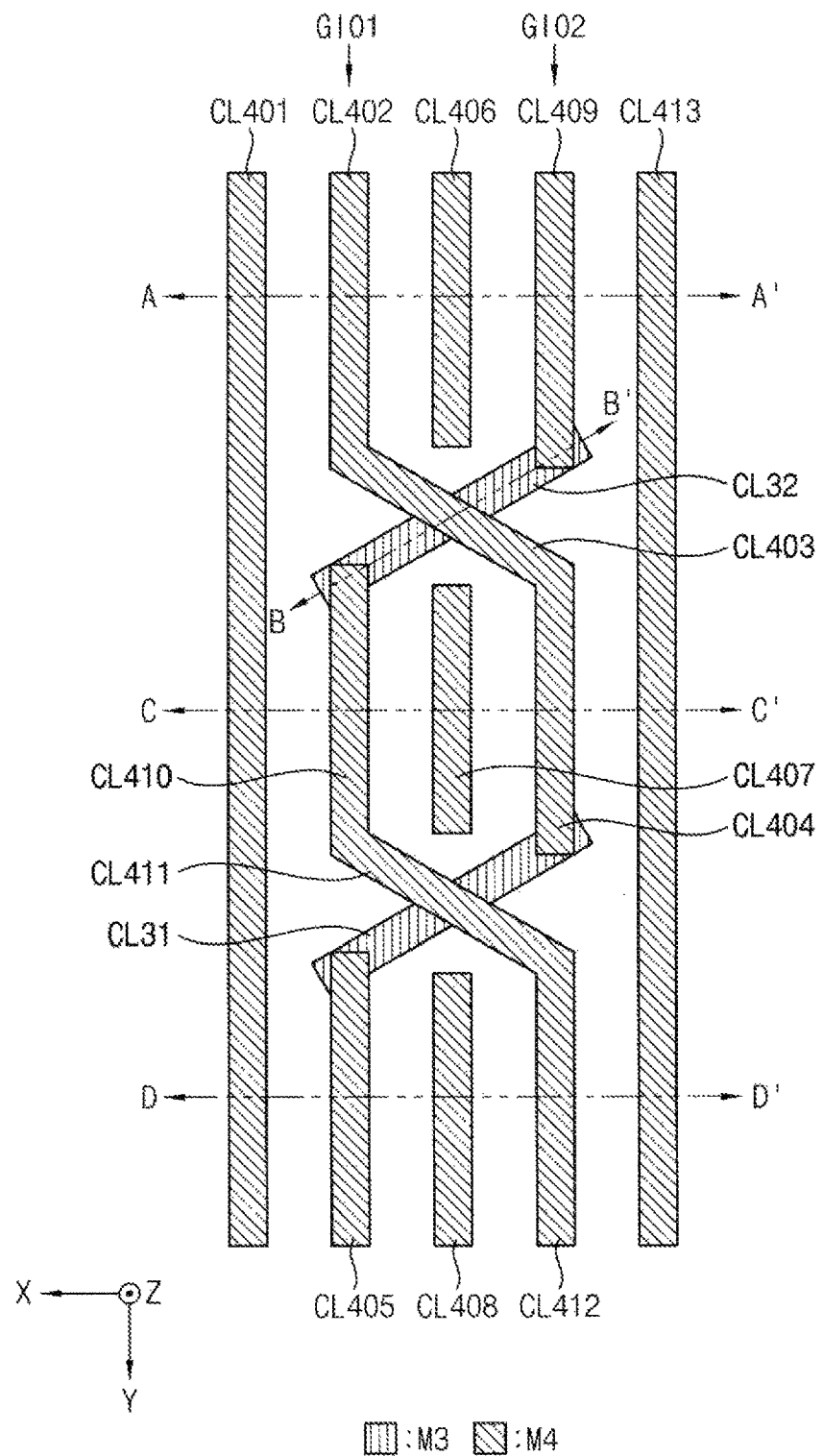
FIG. 10 is a diagram illustrating a disposition structure of conduction lines according to example embodiments.
Figure 11C:
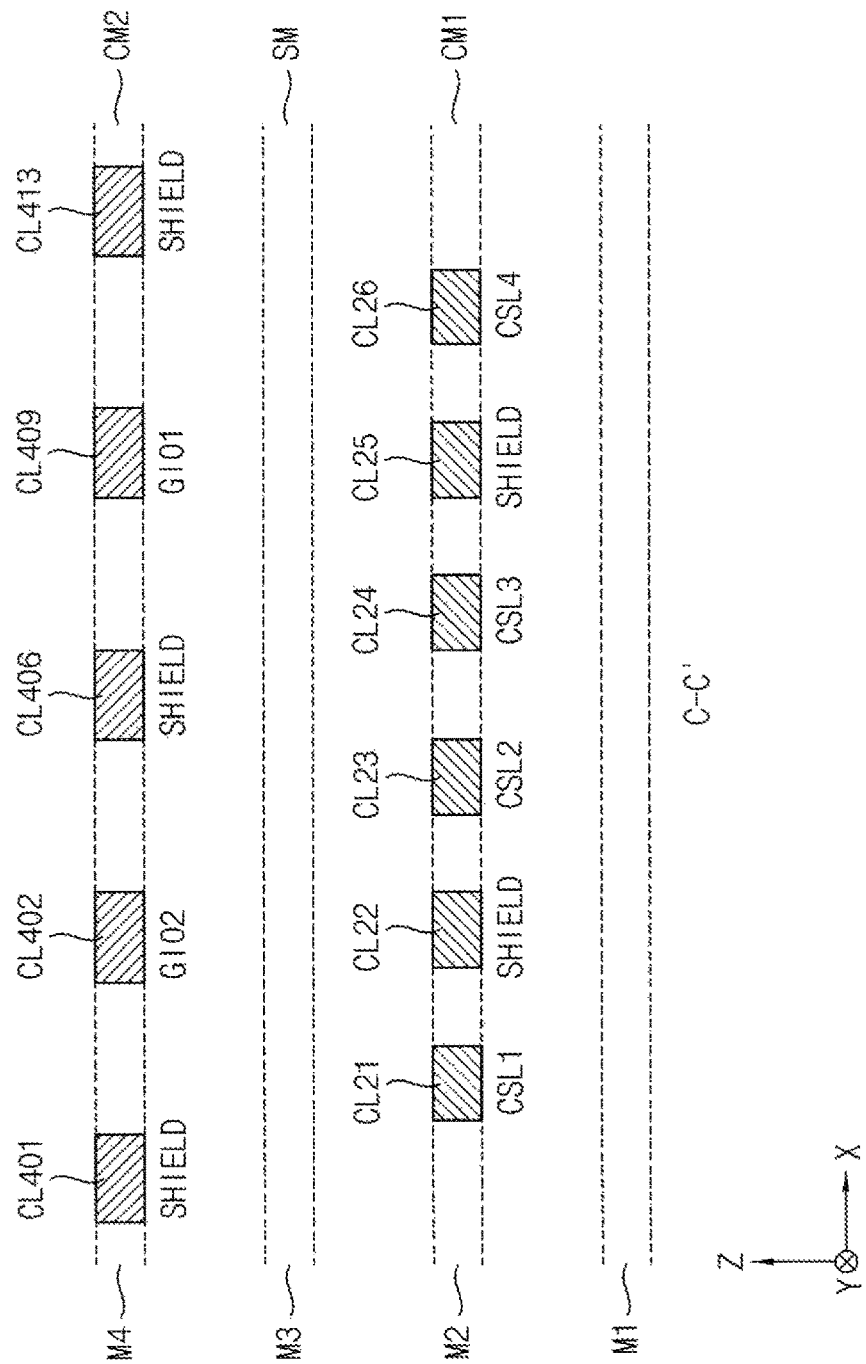

FIG. 10 is a diagram illustrating a disposition structure of conduction lines according to example embodiments, and FIGS. 11A, 11B and 11C are cross-sectional diagrams illustrating the distribution structure of the conduction lines of FIG. 10.

FIG. 11A illustrates a cross-sectional view by the cutting line A-A' or D-D' in FIG. 10, FIG. 11B illustrates a cross-sectional view by the cutting line B-B' in FIG. 10, and FIG. 11C illustrates a cross-sectional view by the cutting line C-C' in FIG. 10.

Referring to FIGS. 10, 11A, 11B and 11C, conduction lines or line segments CL21, CL22, CL23, CL24, CL25, and CL26 corresponding to column selection signal lines CSL1, CSL2, CSL3, CSL4 and two shield lines SHIELD may be formed in the second conduction layer M2 corresponding to the first column conduction layer CM1. In some embodiments, conduction lines or line segments CL21, CL23, CL24, and CL26 formed in the second conduction layer M2 corresponding to the first column conduction layer CM1 correspond to column selection signal lines CSL1, CSL2, CSL3, and CSL4 respectively and conduction lines or line segments CL22 and CL25 formed in the second conduction layer M2 corresponding to the first column conduction layer CM1 correspond to the two shield lines SHIELD such that one shield line SHIELD is disposed between the conduction line or line segments CL21 and CL23 in the row direction X and the other shield line SHIELD is disposed between the conduction line or line segments CL24 and CL26 in the row direction X. Conduction lines or line segments CL401~CL413 corresponding to first and second global input-output data lines GIO1 and GIO2 and the shield lines SHIELD may be formed in the fourth conduction layer M4 corresponding to the second column conduction layer CM2. In some embodiments, each of the conduction lines or line segments CL401, CL406, and CL413 formed in the fourth conduction layer M4 corresponding to the second column conduction layer CM2 corresponds to respective shield line SHIELD, conduction line or line segment CL402 formed in the fourth conduction layer M4 corresponding to the second column conduction layer CM2 corresponds to the first global input-output data line GIO1, and conduction line or line segment CL409 formed in the fourth conduction layer M4 corresponding to the second column conduction layer CM2 corresponds to the second global input-output data line GIO2. In some embodiments, the first global input-output data line GIO1 may be disposed between the conduction lines or line segments CL401 and CL406 corresponding to the shield lines SHIELD in the row direction X and the second global input-output data line GIO2 may be disposed between the conduction lines or line segments CL406 and CL413 corresponding to the shield lines SHIELD in the row direction X. First and second jumper line segments CL31 and CL32 may be formed in the third conduction layer M3 corresponding to the shield conduction layer SM.

As described above, the column selection signal lines CSL1~CSL4 and the global input-output data lines GIO1 and GIO2 may extend in the column direction Y. The first and second global input-output data lines GIO1 and GIO2 are adjacent in the row direction X.

The first global input-output data line GIO1 may include first line segments CL402, CL403, CL404 and CL405 extending in the column direction Y and the second global input-output data line GIO2 may include second line segments CL409, CL410, CL411 and CL412 extending in the column direction Y.

As illustrated in FIG. 10, a position of a first exchanging line segment CL404 of the first line segments CL402, CL403, CL404 and CL405 may be exchanged with a position of a second exchanging line segment CL410 of the second line segments CL409, CL410, CL411 and CL412 such that the first global input-output data line GIO1 and the second global input-output data line GIO2 may cross each other.

As illustrated in FIG. 11B, the second exchanging line segment CL410 and one second line segment CL409 may be connected through vertical contacts VC1 and VC2 to the second jumper line segment CL32 that is formed in the third conduction layer M3 corresponding to the shield conduction layer SM below the fourth conduction layer M4 corresponding to the second column conduction layer CM2. In one embodiment, even though not illustrated, the first exchanging line segment CL404 and one first line segment CL405 may be connected through vertical contacts to the first jumper line segment CL31 that is formed in the third conduction layer M3 below the second column conduction layer M4.

For example, if coupling between the first global input-output data line GIO1 and the first column selection signal line CSL1 is considered, the first column selection signal line CSL1 is located relatively near the line segment CL402 of the first global input-output data line GIO1 as illustrated in FIG. 11A but the first column selection signal line CSL1 is located relatively far from the line segment CL409 of the first global input-output data line GIO1.

As such, the coupling between the global input-output data lines and the column selection signal lines may be reduced using crossing structure as that of the first global input-output data line GIO1 and the second global input-output data line GIO2.

Figure 12:
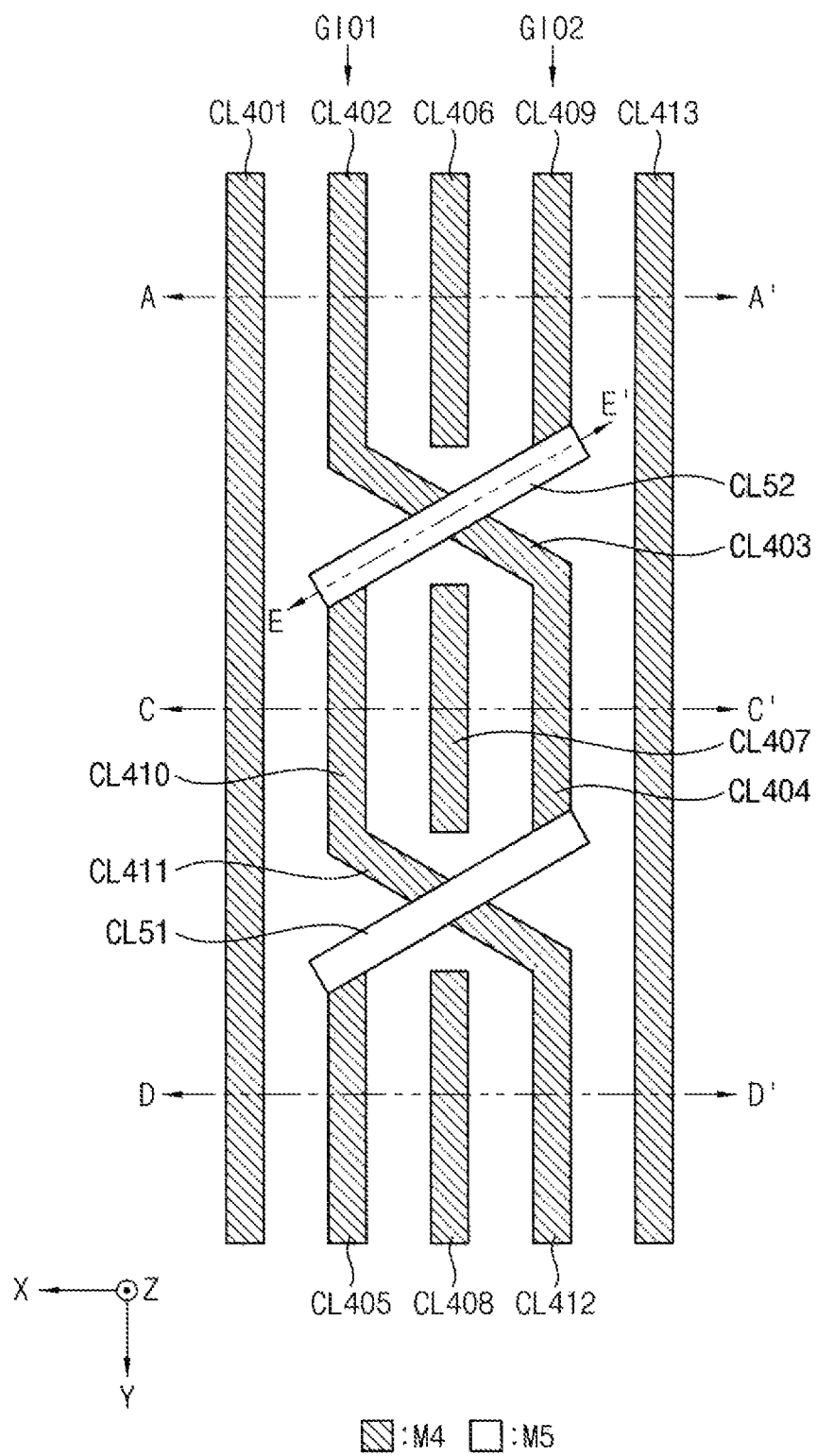
FIG. 12 is a diagram illustrating a disposition structure of conduction lines according to example embodiments.

FIG. 12 is a diagram illustrating a disposition structure of conduction lines according to example embodiments, and FIG. 13 is a cross-sectional diagram illustrating the distribution structure of the conduction lines of FIG. 12.

FIG. 13 illustrates a cross-sectional view by the cutting line E-E' in FIG. 12. The cross-sectional views by the cutting lines A-A', C-C' and D-D' are the same as FIGS. 11A and 11C.

In the example embodiments of FIGS. 10 through 11C, first and second jumper line segments CL31 and CL32 are formed in the third conduction layer M3 below the second column conduction layer M4. In the example embodiments of FIGS. 12 and 13, first and second jumper line segments CL51 and CL52 are formed in the conduction layer M5 over the fourth conduction layer M4 corresponding to the second column conduction layer CM2. The descriptions other than the positions of the jumper line segments are the same as FIGS. 10 through 11C, and thus the repeated descriptions are omitted.

Referring to FIGS. 12 and 13, the second exchanging line segment CL410 and one second line segment CL409 may be connected through vertical contacts VC1 and VC2 to the second jumper line segment CL52 that is formed in the conduction layer M5 over the second column conduction layer M4. In some embodiments, even though not illustrated, the first exchanging line segment CL404 and one first line segment CL405 may be connected through vertical contacts to the first jumper line segment CL51 that is formed in the conduction layer M5 over the second column conduction layer M4.

As such, the coupling between the global input-output data lines and the column selection signal lines may be reduced using crossing structure as that of the first global input-output data line GIO1 and the second global input-output data line GIO2.

Figure 14A:
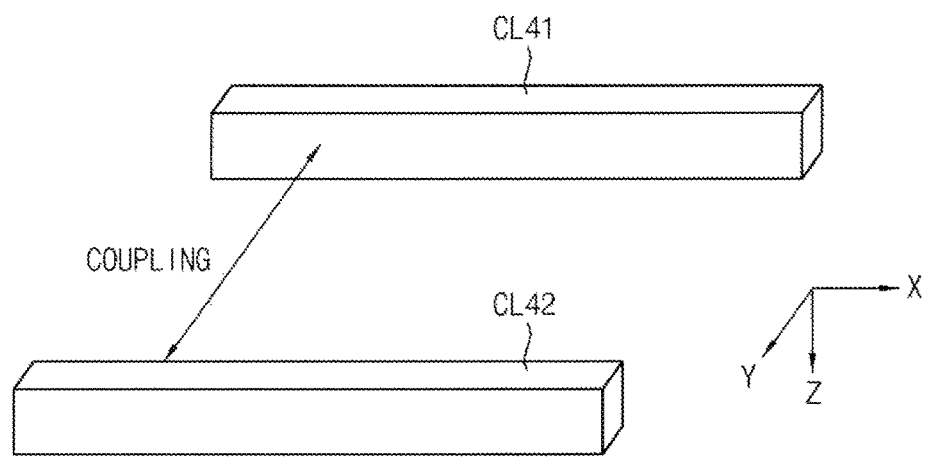
FIGS. 14A and 14B are diagrams for describing disposition structures of conduction lines according to example embodiments.
Figure 14B:
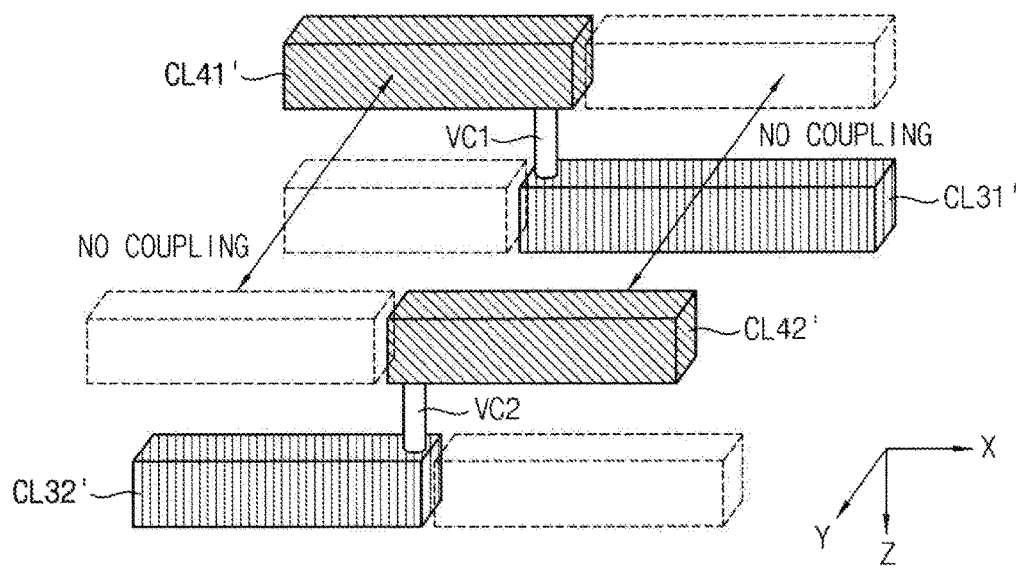

FIGS. 14A and 14B are diagrams for describing disposition structures of conduction lines according to example embodiments.

Referring to FIG. 14A, the global input-output data lines formed in the second column conduction layer CM2 corresponding to the fourth conduction layer M4 may extend in the column direction Y and may include a first line CL41 that corresponds to the first global input-output data line GIO1 and a second line CL42 that corresponds to the second global input-output data line GIO2 that are adjacent in the row direction X. The coupling between the adjacent first and second lines CL41 and CL42 may be severe and thus the coupling may be reduced using a modified structure as FIG. 14B.

Referring to FIG. 14B, the first global input-output data line may include a first upper line segment CL41' formed in the second column conduction layer CM2 and extending in the column direction Y and a first lower line segment CL31' formed in the shield conduction layer SM below the second column conduction layer CM2 and extending in the column direction Y. The first upper line segment CL41' and the first lower line segment CL31' may be connected though the vertical contact VC1.

The second global input-output data line may include a second lower line segment CL32' formed in the shield conduction layer SM and extending in the column direction Y and a second upper line segment CL42' formed in the second column conduction layer CM2 and extending in the column direction Y. The second upper line segment CL42' and the second lower line segment CL32' may be connected though the vertical contact VC2.

In comparison with the structure of FIG. 14A, the second lower line segment CL32' may be located relatively far from the corresponding first upper line segment CL41', and thus coupling between them may be reduced. In one embodiment, the second upper line segment CL42' may be located relatively far from the corresponding first lower line segment CL31' and thus coupling between them may be reduced.

Even though the embodiments are described for the global input-output data lines with reference to FIGS. 14A and 14B, the structure of FIG. 14B may be applied arbitrary signal lines in addition to the global input-output data lines.

Figure 15:
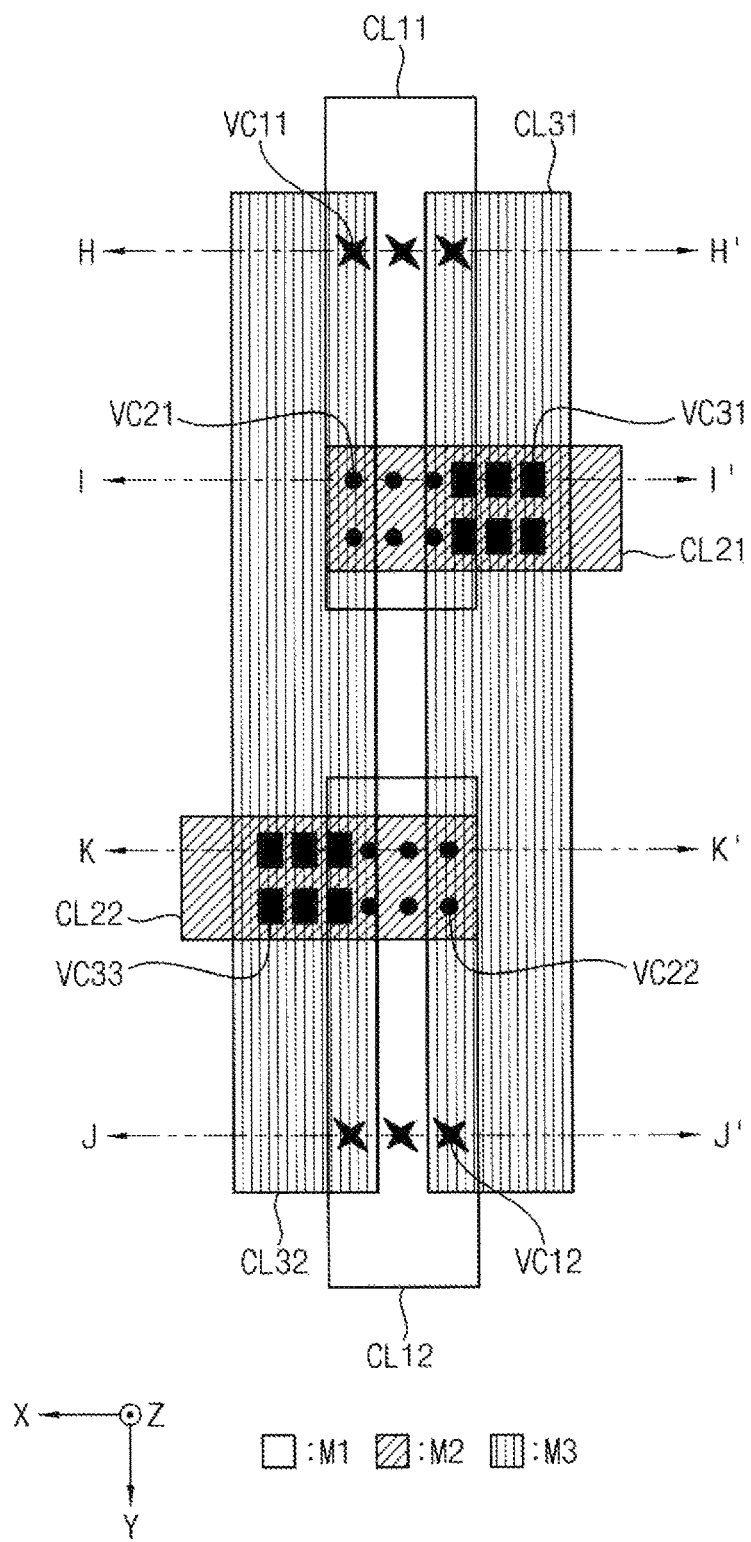
FIG. 15 is a diagram illustrating a disposition structure of conduction lines according to example embodiments.
Figure 16A:
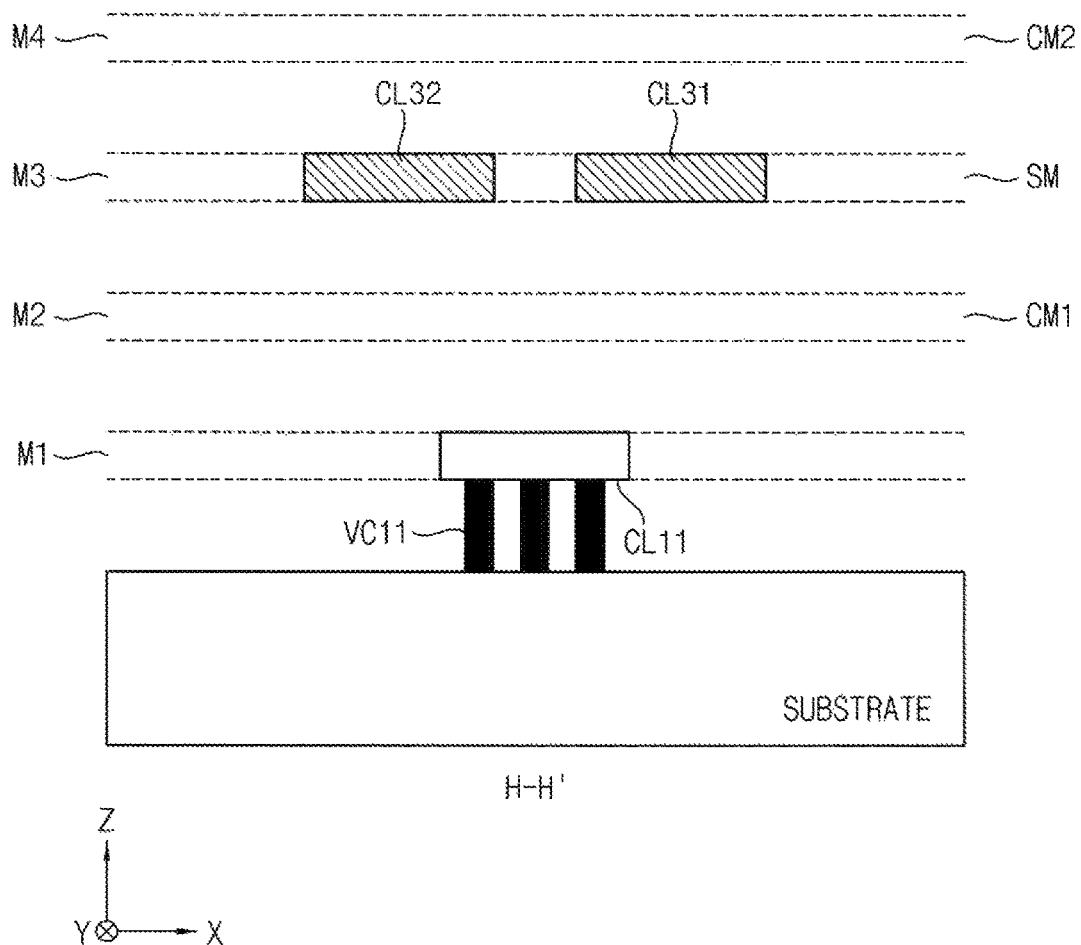
FIGS. 16A, 16B, 16C, and 16D are cross-sectional diagrams illustrating the distribution structure of the conduction lines of FIG. 15.
Figure 16B:
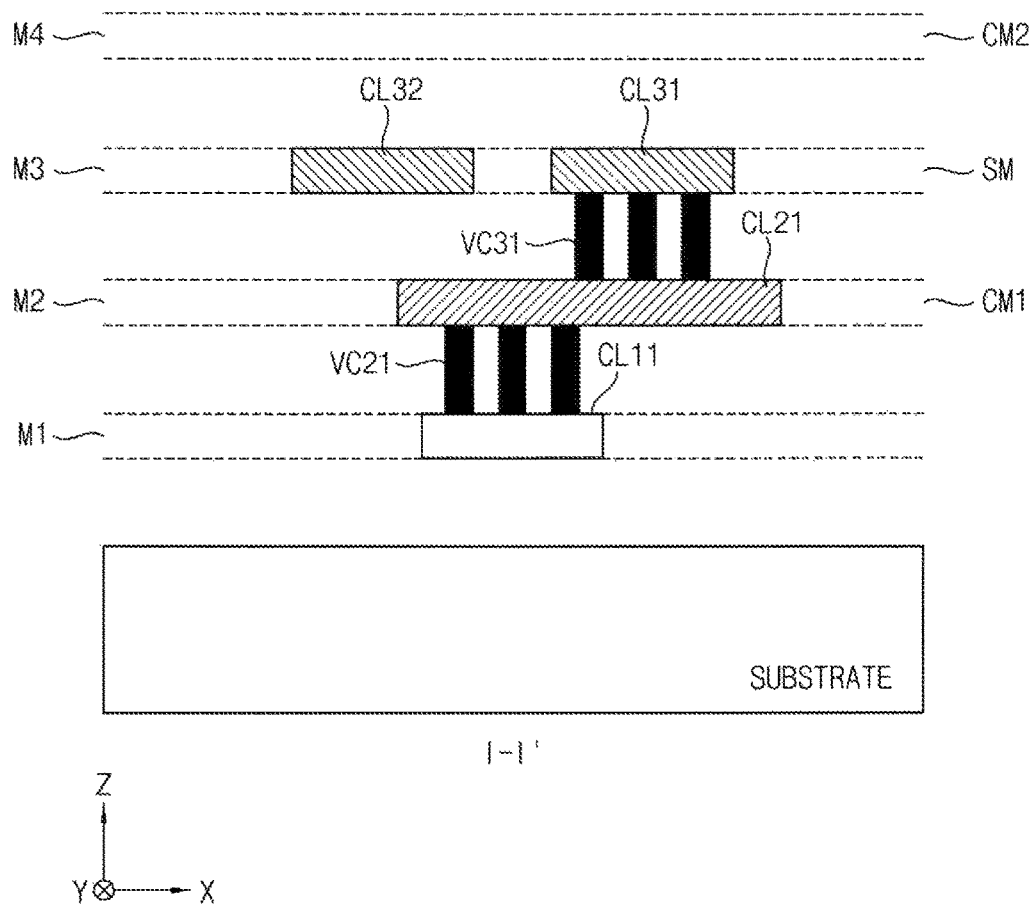
Figure 16C:
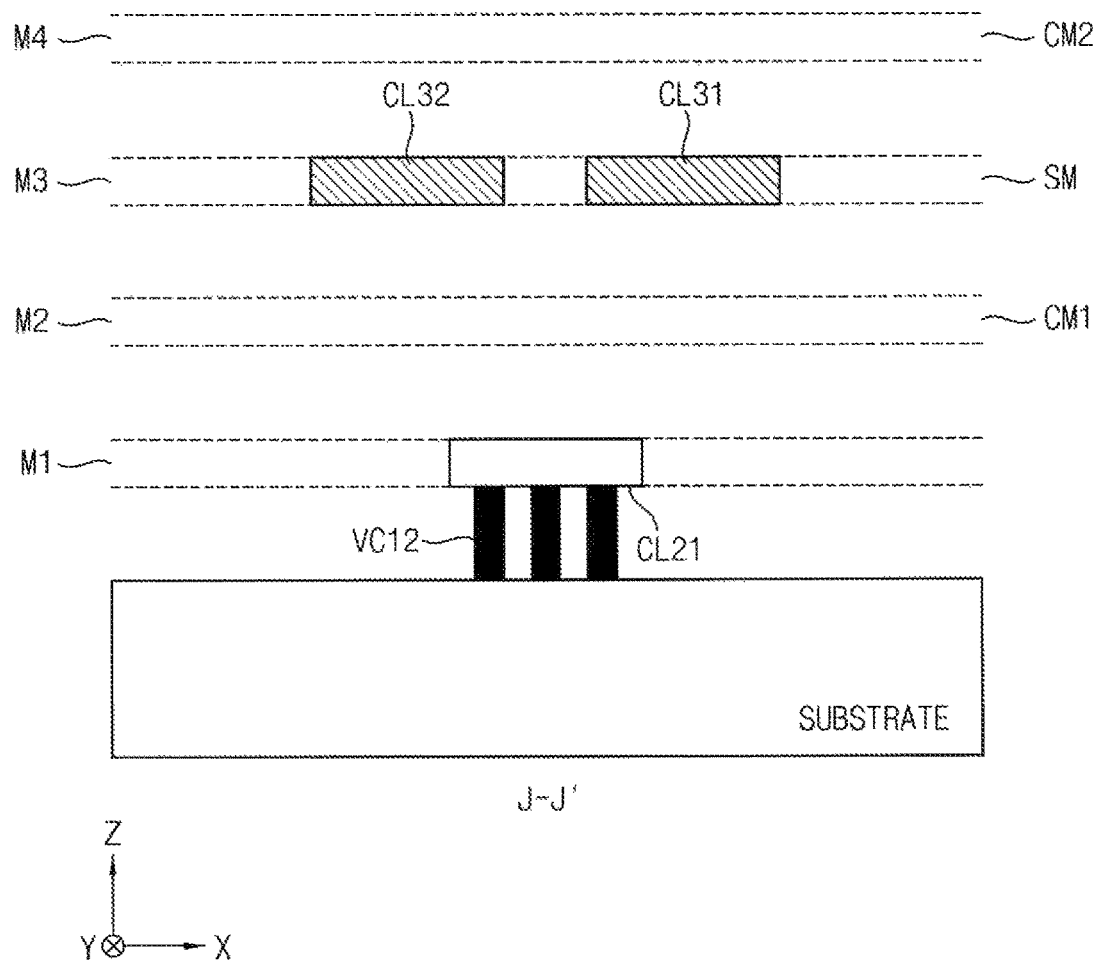

FIG. 15 is a diagram illustrating a disposition structure of conduction lines according to example embodiments, and FIGS. 16A, 16B and 16C are cross-sectional diagrams illustrating the distribution structure of the conduction lines of FIG. 15.

Figure 16D:
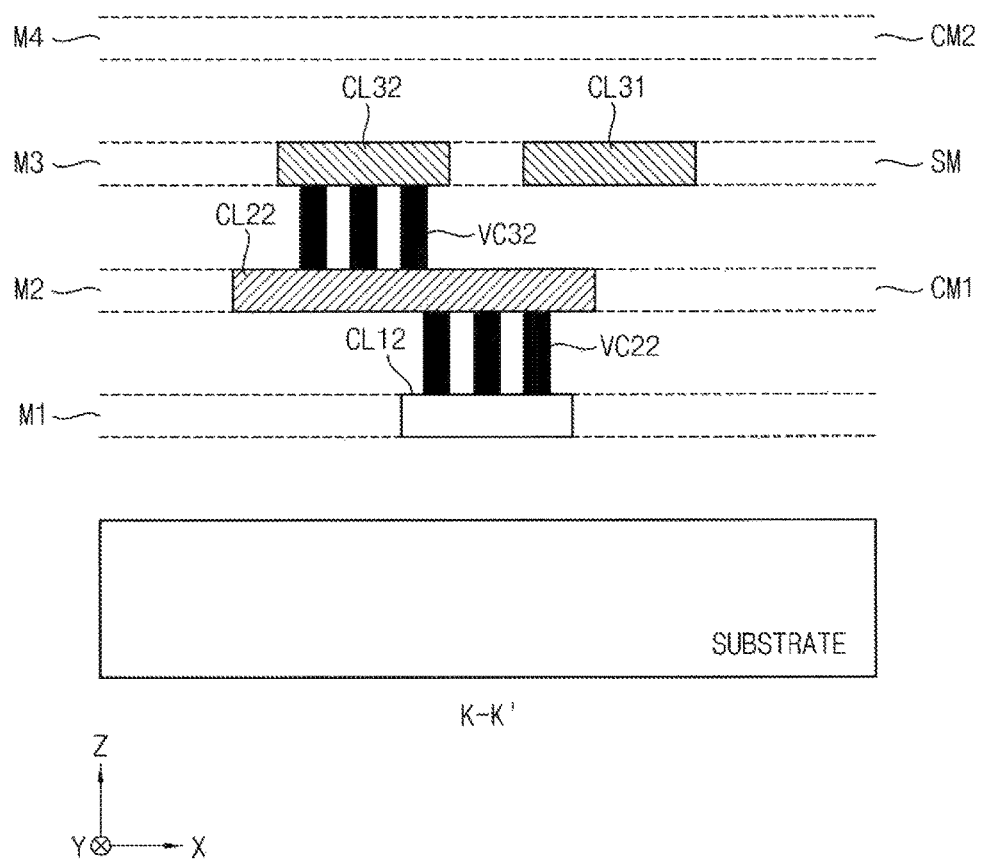

FIG. 16A illustrates a cross-sectional view by the cutting line H-H' in FIG. 15, FIG. 16B illustrates a cross-sectional view by the cutting line I-I' in FIG. 15, FIG. 16C illustrates a cross-sectional view by the cutting line J-J' in FIG. 15, and FIG. 16D illustrates a cross-sectional view by the cutting line K-K' in FIG. 15.

Referring to FIGS. 15, 16A, 16B, 16C and 16D, a distribution structure may include a first power line CL11, a second power line CL12, a third power line CL31, a fourth power line CL32, a first connection line CL21 and a second connection line CL22.

The first power line CL11 is formed in a first conduction layer M1 below the shield conduction layer M3 and extends in a first direction, e.g., the column direction Y. The second power line CL12 is formed in the first conduction layer M1 and extends in the first direction, e.g., the column direction Y. The first power line CL11 and the second power line CL12 are disposed on a same line in the column direction Y.

The third power line CL31 is formed in the shield conduction layer M3 and extends in the first direction Y The fourth power line CL32 is formed in the shield conduction layer M3 and extends in the first direction Y. The third power line CL31 and the fourth power line CL32 are disposed in parallel to each other in a second direction, e.g., the row direction X perpendicular to the first direction, e.g., the column direction Y.

The first connection line CL21 is formed in a second conduction layer M2 between the first conduction layer M1 and the shield conduction layer M3 and connected through first vertical contacts VC21 and VC31 to the first power line CL11 and the third power line CL31. The second connection line CL22 is formed in the second conduction layer M2 and connected through second vertical contacts VC22 and VC33 to the second power line CL12 and the fourth power line CL32.

Various contacts described herein may be, for example, formed of a conductive material such as a metal. The wiring patterns described herein may also be formed of a conductive material, for example, a metal.

The first power line CL11 may be connected to a portion of the semiconductor substrate under the first conduction layer M1 through the vertical contacts VC11 and the second power line CL12 may be connected to another portion of the semiconductor substrate though the vertical contacts VC12.

The first power line CL11 and the second power line CL12 may provide different voltages to the semiconductor substrate through such disposition structure. In some example embodiments, one of the first and second power lines CL11 and CL12 may provide a power supply voltage and the other may provide a ground voltage. In other example embodiments, one of the first and second power lines CL11 and CL12 may provide a virtual power supply voltage and the other may provide a virtual ground voltage for power gating.

As such, the design margin of the first conduction layer M1 may be improved and the power characteristics may be enhanced by providing voltages using the power lines CL11 and CL12 that are disposed on the same line when view from the top and the power lines CL31 and CL32 that are disposed in parallel when viewed from the top.

Figure 17:
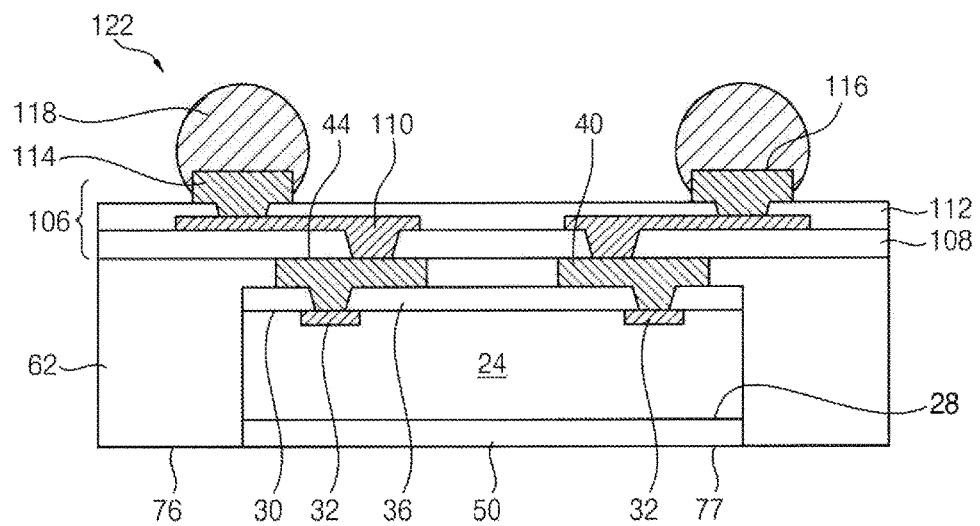
FIG. 17 is a diagram illustrating a semiconductor package including redistribution lines.

FIG. 17 is a diagram illustrating a semiconductor package including redistribution lines.

Referring to FIG. 17, a semiconductor package 122 may be implemented by forming an integrated circuit and packaging them. The semiconductor die 24 may have a back surface 28 (e.g., bottom surface) and an active surface 30 (e.g., top surface) opposite to the back surface 28. The back surface of the semiconductor package 122 may include a portion 76 of sealing material and a base substrate 77. The semiconductor die 24 may include analog and/or digital circuits with active elements, passive elements, conduction layers dielectric layers, etc. that are electrically connected.

A conduction layer may be formed on the active surface 30 using PVD, CVD, electrolytic plating, electroless plating, or other suitable process. An insulating or passivation layer 36 can also be optionally disposed over the active surface 30 and the contact pads 32 of the semiconductor die 24.

A redistribution layer (RDL) including multiple RDL traces 40 may be formed though patterning, sputtering, electrolytic plating, electroless plating, or other suitable process. The RDL trace 40 may be formed of Al, Cu, Sn, Ni, Au, Ag, etc. The RDL trace 40 may be connected to the contact pad 32.

A passivation layer 50 may be formed at the back surface 28 of the semiconductor die 24 to cover the back surface 28.

A connection structure 106 composed of insulating layers 108, 112, and conduction layers 110 and 114 may be formed to provide electrical connections between the semiconductor die 24, the RDL traces 40 and external devices.

The insulating layer 108 is applied to the sealing material 62 and the upper surface 44 of the RDL traces 40. A portion of the insulating layer 108 may be processed to provide an opening on the upper surface 44 of the RDL trace 40.

The conduction layer 110 may be formed and in contact with the RDL traces 40, the sealing material 62 and the insulating layer 108.

The conduction layer 114 may be formed on the conduction layer 110 and the insulating layer 112. The conduction layer 114 may include a portion used as a pad 116.

The various pads of a device (e.g., the semiconductor package 122) described herein may be conductive terminals connected to internal wiring of the device, and may transmit signals and/or supply voltages between an internal wiring and/or internal circuit of the device and an external source. For example, contact pads 32 and pad 116 may electrically connect to and transmit supply voltages and/or signals between an integrated circuit of the semiconductor die 24 and a device to which the semiconductor die 24 is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

FIGS. 18A, 18B, 18C, 19, 20 and 21 are diagrams for describing disposition structures of conduction lines using redistribution lines according to example embodiments.

Figure 18A:
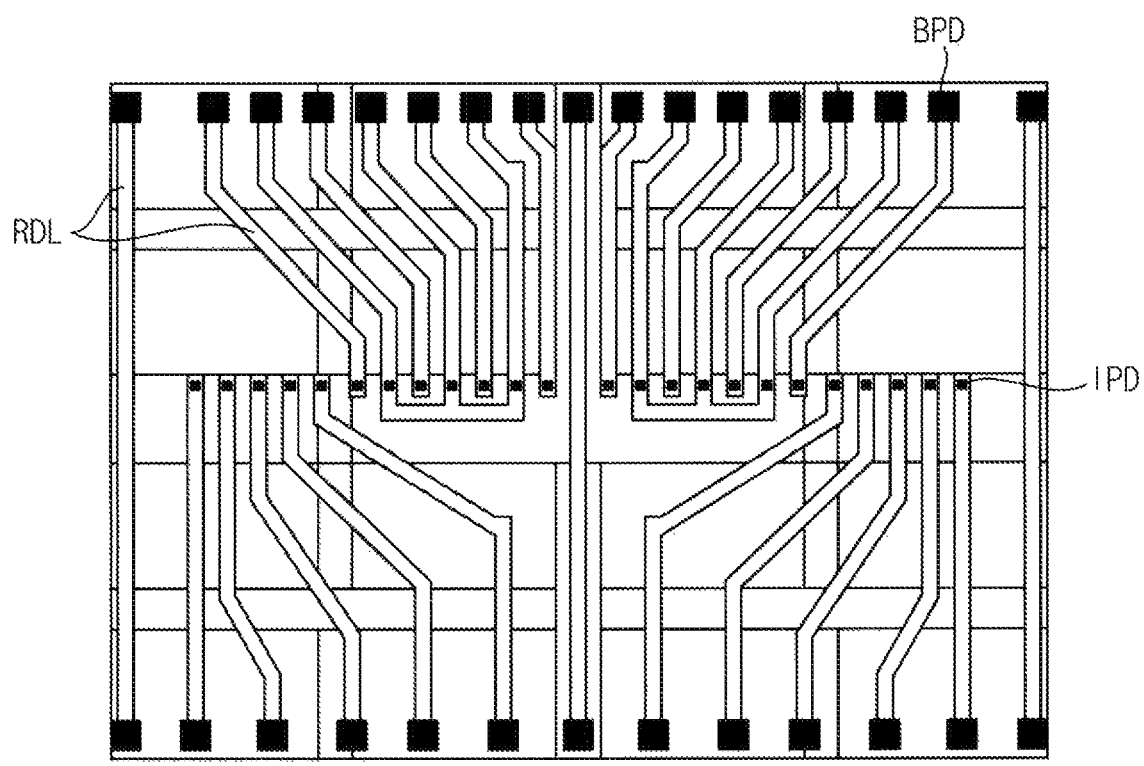
FIGS. 18A, 18B, 18C, 19, 20 and 21 are diagrams for describing disposition structures of conduction lines using redistribution lines according to example embodiments.

Referring to FIG. 18A, through the packaging as illustrated in FIG. 17, bonding pads BPD may be formed on a surface of semiconductor device for electrical connection to an external device, and redistribution lines RDL may be formed for electrical connections between the bonding pads BPD and an internal circuit.

Figure 18B:
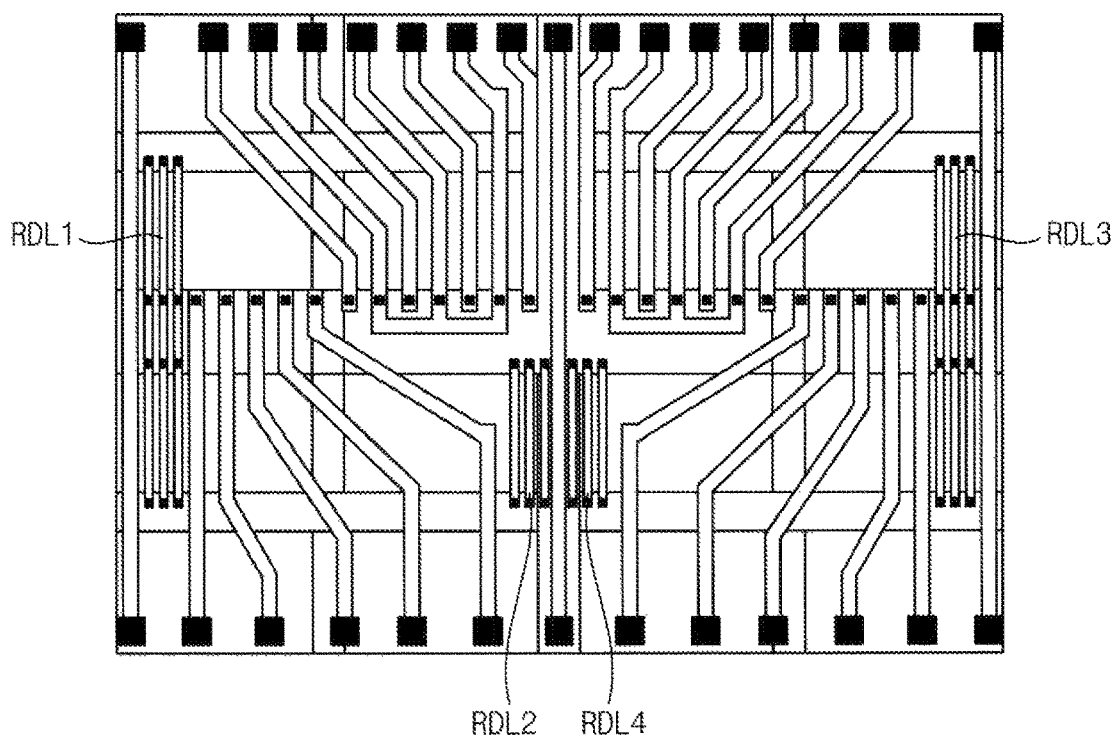
Figure 18C:
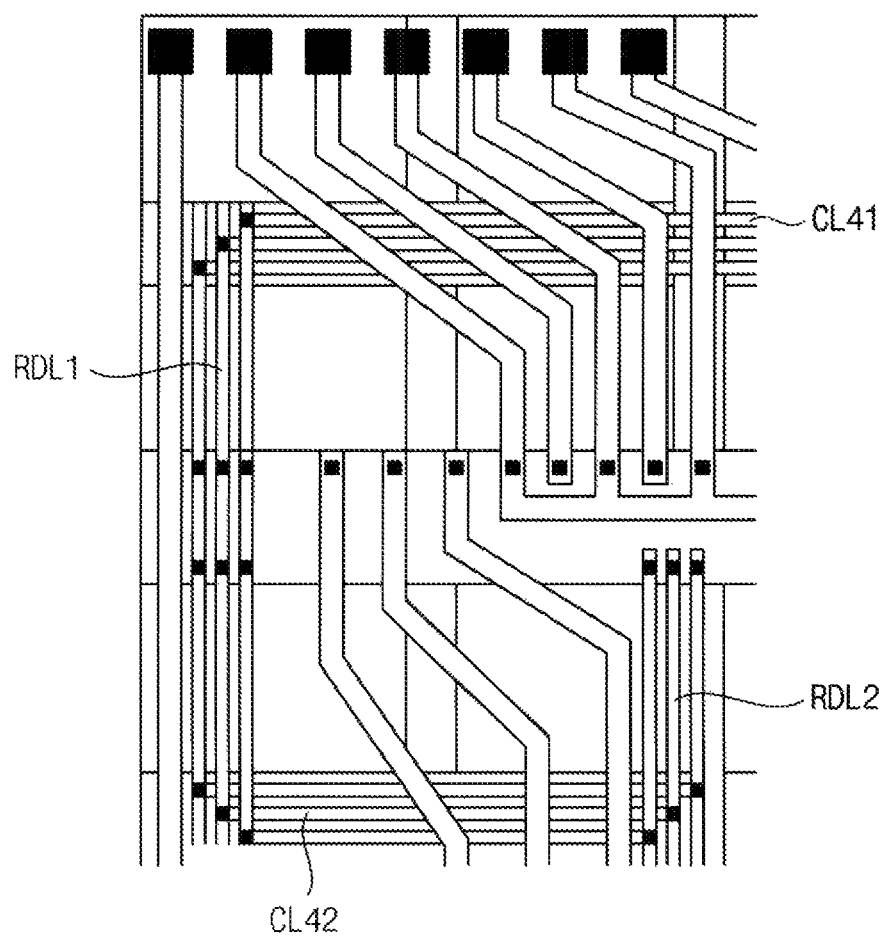

In comparison with the disposition structure of FIG. 18A, the disposition structure of FIG. 18B further includes internal connection redistribution lines RDL1~RDL4. FIG. 18C illustrates an enlarged view of a portion of FIG. 18B. Using the internal connection redistribution lines RDL1~RDL4, the conduction lines CL41 and CL43 formed on the uppermost conduction layer (e.g., uppermost metal layer) may be connected electrically to one another.

Figure 19:
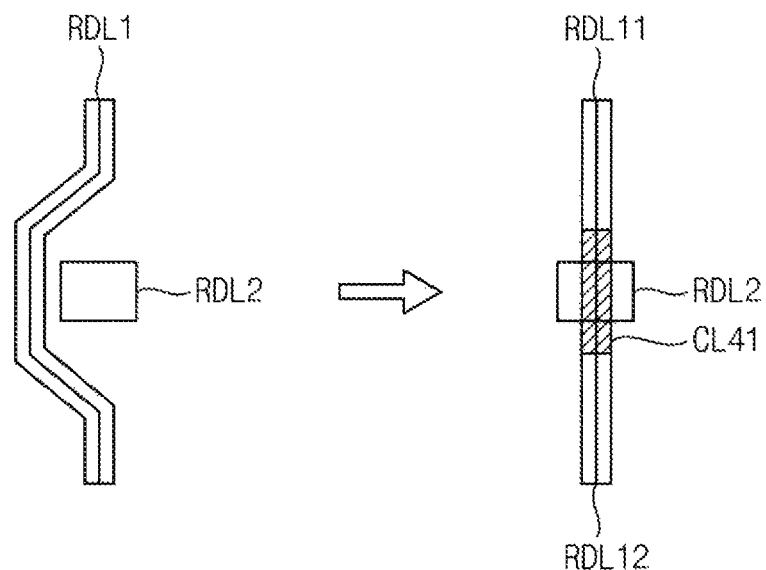
Figure 20:
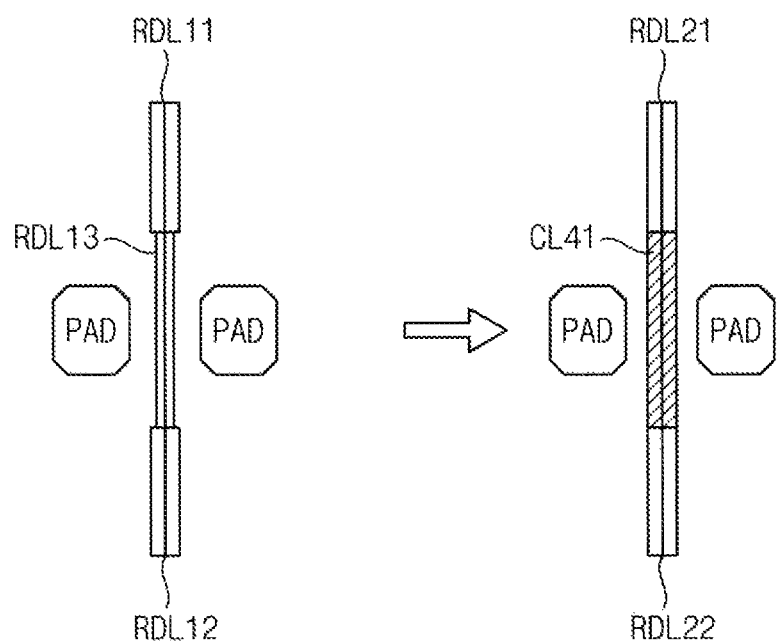
Figure 21:
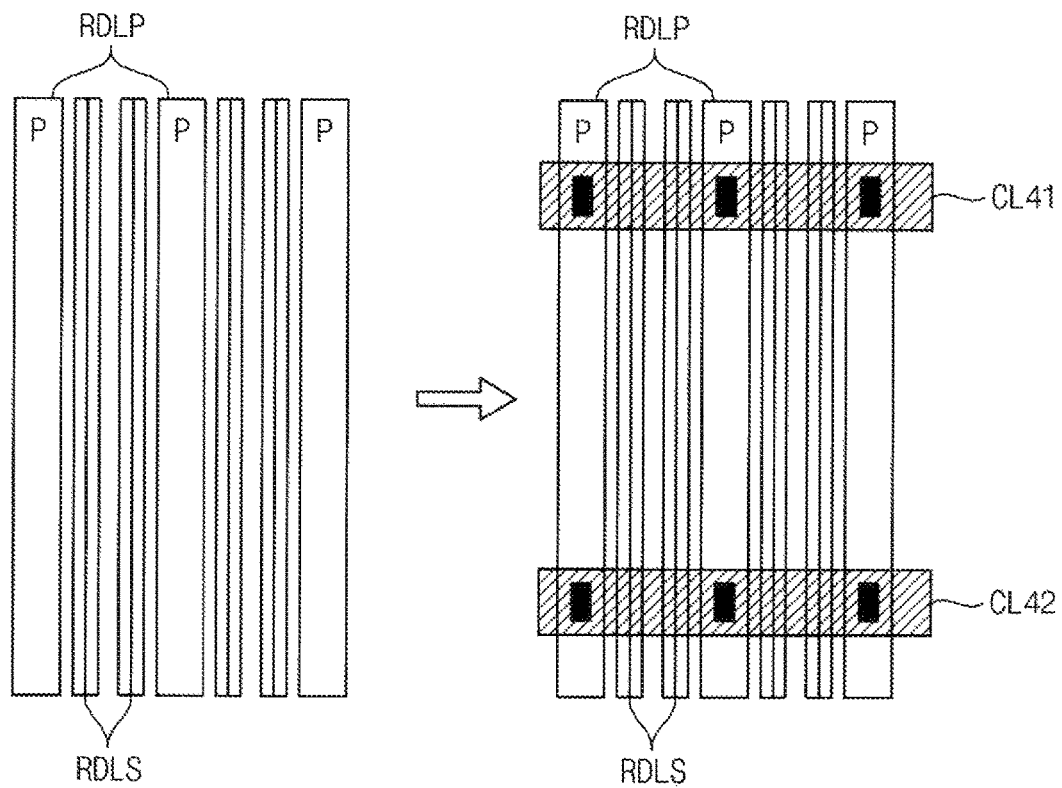

FIGS. 19, 20 and 21 illustrate example embodiments of disposition structure of conduction lines using redistribution lines.

As illustrated in a left portion of FIG. 19, the electric characteristic of a redistribution line RDL1 has a bended shape due to another redistribution line RDL2 and thus electric characteristic of the redistribution lines may be degraded.

As illustrated in a right portion of FIG. 19, the redistribution line RDL1 may be divided into line segments RDL11 and RDL12 that may be connected to each other using a conduction line CL41 formed in the uppermost conduction layer to enhance the electric characteristic of the redistribution lines. The line segments RDL11 and RDL12 formed in the RDL layer and the conduction line CL41 formed in the uppermost conduction layer may be connected through vertical contacts.

As illustrated in a left portion of FIG. 20, a line segment RDL13 of a redistribution line RDL11, RDL13 and RDL12 passing through pads PAD may be narrowed due to restrictions of manufacturing processes.

As illustrated in a right portion of FIG. 20, the line segment RDL21 between the pads PAD may be replaced with a line segment CL41 formed in the uppermost conduction layer to enhance the electric characteristic of the redistribution lines. The line segments RDL21 and RDL22 formed in the RDL layer and the conduction line CL41 formed in the uppermost conduction layer may be connected through vertical contacts.

As illustrated in a left portion of FIG. 21, redistribution lines RDLP for providing power and redistribution lines RDLS for transferring signals may be interleaved.

As illustrated in a right portion of FIG. 21, the redistribution lines RDLP for providing the same voltage may be connected to one another using the conduction lines CL41 and CL42 that are formed in the uppermost conduction layer to enhance the power characteristic of the device. The power lines RDLP formed in the RDL layer and the conduction lines CL41 and CL42 formed in the uppermost conduction layer may be connected through vertical contacts.

Figure 22A:
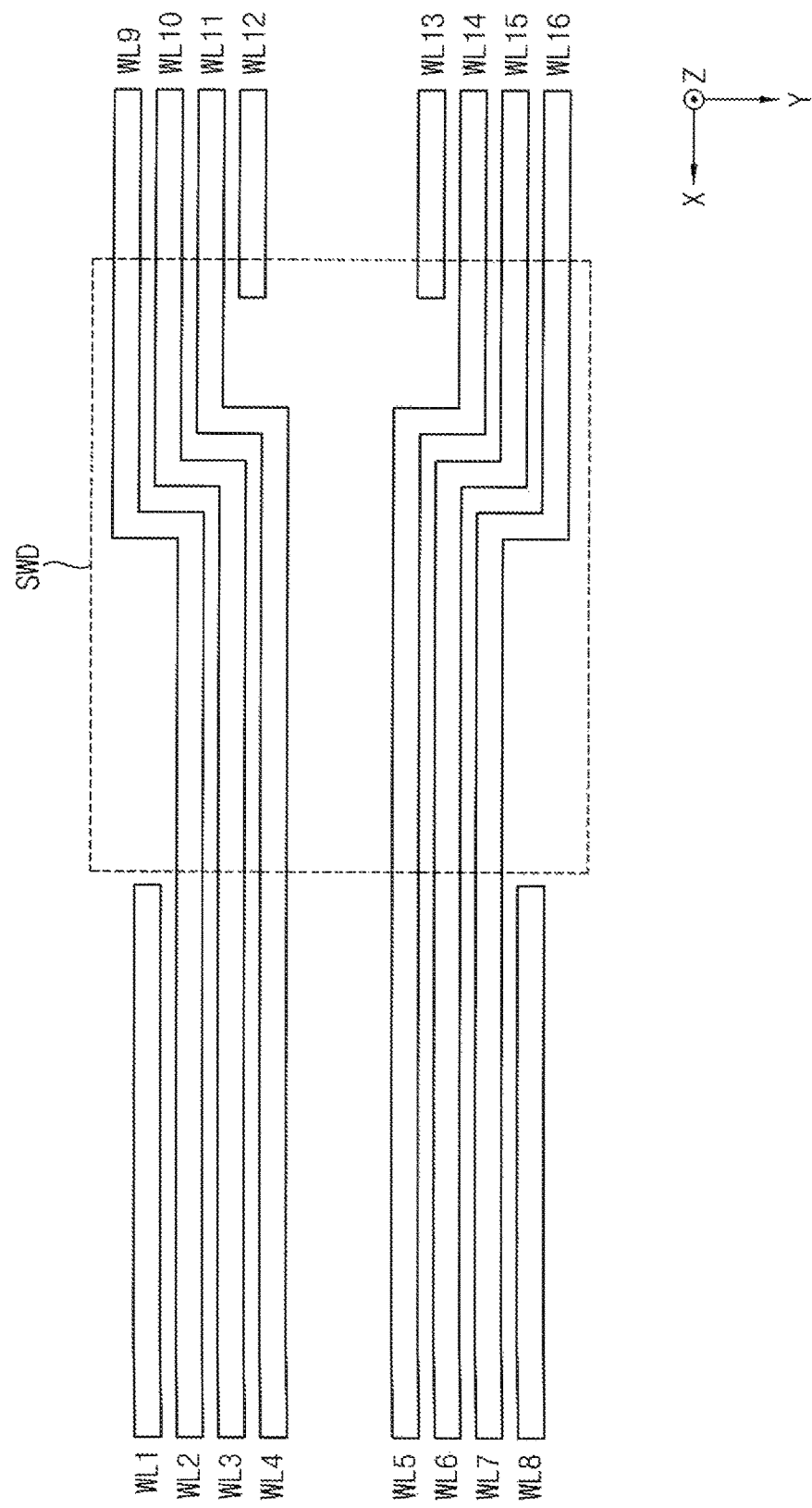
FIGS. 22A and 22B are diagrams for describing disposition structures of conduction lines according to example embodiments.
Figure 22B:
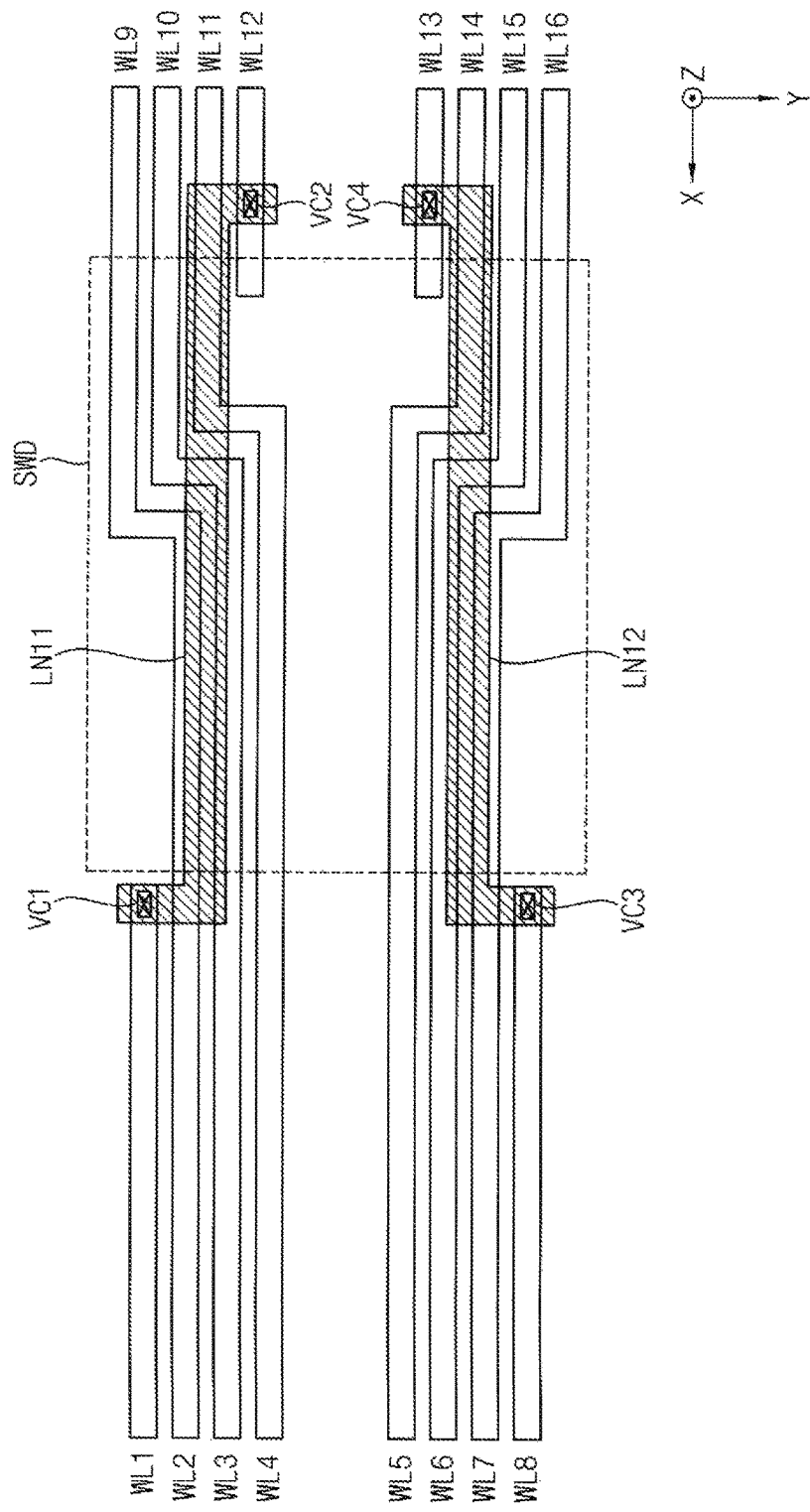

FIGS. 22A and 22B are diagrams for describing disposition structures of conduction lines according to example embodiments.

Referring to FIG. 22A, a plurality of sub wordlines WL1~WL16 may be formed in a polysilicon layer of the memory cell array region and extend in the row direction X to penetrate a sub wordline driver region SWD. Each of the sub wordlines at the left side of the sub wordline driver region SWD may form a pair with and be connected to each of the sub wordlines at the right side of the sub wordline driver region SWD.

Referring to FIG. 22B, wordline connection lines LN11 and LN12 may be formed in a metal layer over the polysilicon layer to cross the wordline driving region SWD. Each of the wordline connection lines LN11 and LN12 may connect, through vertical contacts VC1~VC4, a pair of sub-wordlines that are disposed at both sides of the wordline driving region.

For example, as illustrated in FIG. 22B, the first wordline connection line LN11 may connect the sub wordlines WL1 and WL12 at both sides of the sub wordline driver region SWD, and the second wordline connection line LN12 may connect the sub wordlines WL8 and WL13 at both sides of the sub wordline driver region SWD.

The pitch of the polysilicon lines in the sub wordline driver region SWD may be determined by a cell pitch of the memory cells. Thus the restrictions to the polysilicon line pitch may degrade reliability of sub wordline drivers in the sub wordline driver region SWD because a length of a keeping transistor of the sub wordline driver may be restricted by the narrow polysilicon line pitch.

Using the wordline connection lines LN11 and LN12 as described with reference to FIG. 22B, the restriction of the polysilicon line pitch may be relieved and thus the performance of the memory device may be enhanced.

Figure 23:
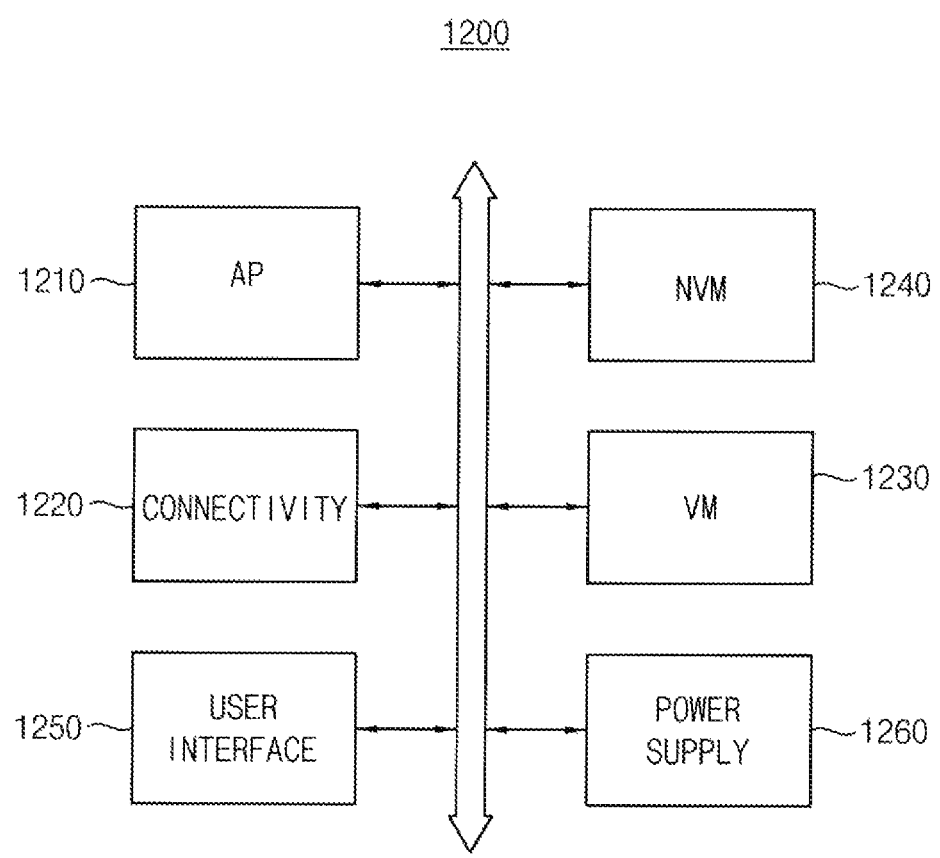
FIG. 23 is a block diagram illustrating a mobile system including a memory device according to example embodiments.

FIG. 23 is a block diagram illustrating a mobile system including a memory device according to example embodiments.

Referring to FIG. 23, a mobile system 1200 includes an application processor 1210, a connectivity unit 1220, a volatile memory device (VM) 1230, a nonvolatile memory device 1240, a user interface 1250, and a power supply 1260.

The application processor 1210 may execute applications such as a web browser, a game application, a video player, etc. The connectivity unit 1220 may perform wired or wireless communication with an external device. The volatile memory device 1230 may store data processed by the application processor 1210, or may operate as a working memory. For example, the volatile memory device 1230 may be a dynamic random access memory, such as DDR SDRAM, LPDDR SDRAM, GDDR SDRAM, RDRAM, etc. The nonvolatile memory device 1240 may store a boot image for booting the mobile system 1200 and other data. The user interface 1250 may include at least one input device, such as a keypad, a touch screen, etc., and at least one output device, such as a speaker, a display device, etc. The power supply 1260 may supply a power supply voltage to the mobile system 1200. In some embodiments, the mobile system 1200 may further include a camera image processor (CIP), and/or a storage device, such as a memory card, a solid state drive (SSD), a hard disk drive (HDD), a CD-ROM, etc.

The volatile memory device 1230 and the nonvolatile memory device 1240 may include disposition structure of conduction lines according to example embodiments as described with reference to FIGS. 1 through 22.

The noises in the signal lines and the power lines may be reduced and performance of the memory device may be enhanced by forming the column selection signal lines and the global input-output data lines in different column conduction layers and forming the power lines in the shield conduction layer between the column conduction layers. In some exemplary embodiments, the memory device (e.g., the volatile memory device 1230 and the nonvolatile memory device 1240) may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The present inventive concept may be applied to any devices and systems including a memory device. For example, the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A memory device including a memory cell array region, the memory device comprising:
   column selection signal lines formed in a first column conduction layer of the memory cell array region and extending in a column direction, wherein the column selection signal lines transfer column selection signals that are generated by decoding a column address;
   global input-output data lines formed in a second column conduction layer of the memory cell array region different from the first column conduction layer and extending in the column direction; and
   power lines formed in a shield conduction layer of the memory cell array region, wherein the shield conduction layer is formed, in a vertical direction, between the first column conduction layer and the second column conduction layer.

2. The memory device of claim 1, wherein the power lines in the shield conduction layer extend in the column direction.

3. The memory device of claim 1, wherein the power lines in the shield conduction layer extend in a row direction perpendicular to the column direction.

4. The memory device of claim 3, further comprising:
   main wordlines formed in the shield conduction layer and extending in the row direction.

5. The memory device of claim 3, further comprising:
   word selection signal lines formed in the shield conduction layer and extending in the row direction.

6. The memory device of claim 1, further comprising:
   power lines formed in the first column conduction layer and extending in the column direction and disposed between the column selection signal lines; and
   power lines formed in the second column conduction layer and extending in the column direction and disposed between the global input-output data lines.

7. The memory device of claim 1, wherein the first column conduction layer corresponds to a second conduction layer directly over a first conduction layer, the shield conduction layer corresponds to a third conduction layer directly over the second conduction layer and the second column conduction layer corresponds to a fourth conduction layer over the third conduction layer.

8. The memory device of claim 7, further comprising:
   local input-output data lines formed in the first conduction layer and extending in a row direction perpendicular to the column direction.

9. The memory device of claim 1, wherein the memory cell array region includes a plurality of bank arrays, and
   wherein at least one of the power lines in the shield conduction layer penetrates, without using vertical contacts, a peripheral circuit region between adjacent bank arrays of the plurality of bank arrays, the adjacent bank arrays being arranged in the column direction.

10. The memory device of claim 1, wherein the global input-output data lines in the second column conduction layer include a first global input-output data line and a second global input-output data line that are adjacent in a row direction perpendicular to the column direction, the first global input-output data line includes first line segments extending in the column direction and the second global input-output data line includes second line segments extending in the column direction, and
    wherein a position of a first exchanging line segment of the first line segments is exchanged with a position of a second exchanging line segment of the second line segments such that the first global input-output data line and the second global input-output data line cross each other.

11. The memory device of claim 10, wherein the first exchanging line segment and one of the first line segments are connected through first vertical contacts to a first jumper line segment that is formed in a conduction layer over or below the second column conduction layer, and
    wherein the second exchanging line segment and one of the second line segments are connected through second vertical contacts to a second jumper line segment that is formed in a conduction layer over or below the second column conduction layer.

12. The memory device of claim 1, wherein the global input-output data lines include a first global input-output data line and a second global input-output data line that are adjacent in a row direction perpendicular to the column direction, the first global input-output data line includes a first upper line segment formed in the second column conduction layer and extending in the column direction and a first lower line segment formed in the shield conduction layer below the second column conduction layer and extending in the column direction, and the second global input-output data line includes a second lower line segment formed in the shield conduction layer and extending in the column direction and a second upper line segment formed in the second column conduction layer and extending in the column direction, the second lower line segment corresponding to the first upper line segment, the second upper line segment corresponding to the first lower line segment.

13. The memory device of claim 1, comprising:
a first power line formed in a first conduction layer below the shield conduction layer and extending in a first direction;
a second power line formed in the first conduction layer and extending in the first direction, the first power line and the second power line being disposed on a same line in the first direction;
a third power line formed in the shield conduction layer and extending in the first direction;
a fourth power line formed in the shield conduction layer and extending in the first direction, the third power line and the fourth power line being disposed in parallel to each other in a second direction perpendicular to the first direction;
a first connection line formed in a second conduction layer between the first conduction layer and the shield conduction layer and connected through first vertical contacts to the first power line and the third power line; and
a second connection line formed in the second conduction layer and connected through second vertical contacts to the second power line and the fourth power line.

14. The memory device of claim 13, wherein the first power line and the second power line provide different voltages to a semiconductor substrate below the first conduction layer.

15. The memory device of claim 1, further comprising:
redistribution lines formed in a redistribution layer over an uppermost metal layer of the memory device,
wherein the redistribution lines include at least one inner connection redistribution line to connect metal lines formed in the uppermost metal layer.

16. The memory device of claim 1, further comprising:
a plurality of sub wordlines formed in a polysilicon layer of the memory cell array region; and
one or more wordline connection lines formed in a metal layer over the polysilicon layer to cross a wordline driving region, each wordline connection line connecting through vertical contacts a pair of sub wordlines of the plurality of sub wordlines that are disposed at both sides of the wordline driving region.

17. A memory device including a memory cell array region, the memory device comprising:
local input-output data lines formed in a first conduction layer of the memory cell array region and extending in a row direction;
column selection signal lines formed in a second conduction layer of the memory cell array region different from the first conduction layer of the memory cell array region over the second conduction layer and extending in a column direction perpendicular to the row direction, wherein the column selection signal lines transfer column selection signals that are generated by decoding a column address;
power lines formed in a third conduction layer of the memory cell array region over the second conduction layer; and
global input-output data lines formed in a fourth conduction layer of the memory cell array region over the third conduction layer and extending in the column direction,
wherein the first conduction layer, the second conduction layer, the third conduction layer and the fourth conduction layer are formed sequentially in a vertical direction.

18. The memory device of claim 17, further comprising:
main wordlines and word selection signal lines that are formed in the first conduction layer and extending in the row direction,
wherein the power lines in the third conduction layer extend in the column direction.

19. The memory device of claim 17, further comprising:
main wordlines and word selection signal lines that are formed in the first conduction layer or the third conduction layer and extending in the row direction,
wherein the power lines in the third conduction layer extend in the row direction.

20. A method of disposing conduction lines of a memory device including a memory cell array region, the method comprising:
forming column selection signal lines extending in a column direction in a first column conduction layer of the memory cell array region, wherein the column selection signal lines transfer column selection signals that are generated by decoding a column address;
forming global input-output data lines extending in the column direction in a second column conduction layer of the memory cell array region different from the first column conduction layer of the memory cell array region; and
forming power lines in a shield conduction layer of the memory cell array region, wherein the shield conduction layer is formed, in a vertical direction, between the first column conduction layer and the second column conduction layer.

* * * * *